(12) United States Patent
Kim et al.

(10) Patent No.: US 7,439,574 B2
(45) Date of Patent: Oct. 21, 2008

(54) SILICON/OXIDE/NITRIDE/SILICON NONVOLATILE MEMORY WITH VERTICAL CHANNELS

(75) Inventors: Chung-woo Kim, Seongnam (KR); Byung-gook Park, Seoul (KR); Jong-duk Lee, Seoul (KR); Yong-kyu Lee, Seoul (KR)

(73) Assignees: Samsung Electronics Co., Ltd., Suwon, Kyungki-do (KR); Seoul National University, Seoul (KR)

( * ) Notice: Subject to any disclaimer, the term of this patent is extended or adjusted under 35 U.S.C. 154(b) by 0 days.

(21) Appl. No.: 10/460,673

(22) Filed: Jun. 13, 2003

(65) Prior Publication Data

US 2004/0097044 A1 May 20, 2004

(30) Foreign Application Priority Data

Nov. 15, 2002 (KR) .................. 10-2002-0071042

(51) Int. Cl.
*H01L 21/336* (2006.01)
(52) U.S. Cl. .................. 257/324; 257/316; 257/321; 257/322; 257/E21.415; 257/E21.421; 257/E21.442; 257/E21.703
(58) Field of Classification Search ............. 257/316, 257/321–322, 324
See application file for complete search history.

(56) References Cited

U.S. PATENT DOCUMENTS

| | | | |
|---|---|---|---|
| 6,118,161 A * | 9/2000 | Chapman et al. ............. | 257/401 |
| 6,271,088 B1 * | 8/2001 | Liu et al. .................... | 438/259 |
| 6,300,182 B1 * | 10/2001 | Yu ............................. | 438/217 |
| 6,376,312 B1 * | 4/2002 | Yu ............................. | 438/268 |
| 6,479,852 B1 * | 11/2002 | Wu ............................ | 257/301 |
| 6,963,104 B2 * | 11/2005 | Wu et al. .................... | 257/315 |
| 6,977,413 B2 * | 12/2005 | Hofmann et al. ............ | 257/327 |
| 2002/0011612 A1 * | 1/2002 | Hieda ......................... | 257/262 |

(Continued)

FOREIGN PATENT DOCUMENTS

EP            623963       * 11/1994

(Continued)

OTHER PUBLICATIONS

Lee et al., "Multilevel Vertical-Channel SONOS Nonvolatile Memory on SOI", IEEE Electron Device Letters, 2002; pp. 664-666.*

(Continued)

*Primary Examiner*—Ahmed Sefer
(74) *Attorney, Agent, or Firm*—Lee & Morse, P.C.

(57) ABSTRACT

Provided are a silicon/oxide/nitride/oxide/silicon (SONOS) memory, a fabricating method thereof, and a memory programming method. The SONOS memory includes a substrate; a first insulating layer stacked on the substrate; a semiconductor layer, which is patterned on the first insulating layer in a predetermined shape, including source and drain electrodes separated by a predetermined interval; a second insulating layer located on the semiconductor layer between the source and drain electrodes; a memory layer, which is deposited on sides of a portion of the semiconductor layer between the source and drain electrodes and on sides and an upper surface of the second insulating layer, including electron transferring channels and an electron storing layer; and a gate electrode, which is deposited on a surface of the memory layer, for controlling transfer of electrons in the memory layer. The programming method may provide a large capacity, stable, multi-level memory.

25 Claims, 25 Drawing Sheets

U.S. PATENT DOCUMENTS

| | | | |
|---|---|---|---|
| 2002/0036290 A1* | 3/2002 | Inaba et al. | 257/66 |
| 2002/0096734 A1* | 7/2002 | Natsume | 257/508 |
| 2002/0110983 A1* | 8/2002 | Liu et al. | 438/257 |
| 2002/0137288 A1* | 9/2002 | Nomoto et al. | 438/261 |
| 2002/0179964 A1* | 12/2002 | Kato et al. | 257/316 |
| 2003/0015755 A1* | 1/2003 | Hagemeyer | 257/329 |
| 2003/0123285 A1* | 7/2003 | Ahn et al. | 365/185.05 |
| 2003/0178670 A1* | 9/2003 | Fried et al. | 257/315 |
| 2003/0198086 A1* | 10/2003 | Shukuri | 365/185.18 |
| 2003/0201458 A1* | 10/2003 | Clark et al. | 257/192 |
| 2003/0222318 A1* | 12/2003 | Tanaka et al. | 257/406 |
| 2004/0026733 A1* | 2/2004 | Tomiie et al. | 257/315 |
| 2004/0125629 A1* | 7/2004 | Scheuerlein et al. | 365/17 |
| 2004/0207019 A1* | 10/2004 | Bryant et al. | 257/350 |
| 2004/0217433 A1* | 11/2004 | Yeo et al. | 257/412 |
| 2005/0001216 A1* | 1/2005 | Adkisson et al. | 257/66 |
| 2005/0161711 A1* | 7/2005 | Chu | 257/288 |
| 2005/0236680 A1* | 10/2005 | Yoo | 257/411 |

FOREIGN PATENT DOCUMENTS

| | | | |
|---|---|---|---|
| JP | 11-121708 | * | 4/1999 |
| KR | 95002202 | * | 3/1995 |
| KR | 2003-0020644 | | 3/2003 |

OTHER PUBLICATIONS

Lee et al., "Multilevel Vertical-Channel SONOS Nonvolatile Memory on SOI", Symposium on VLSI Technology Digest of Technical Papers, 2002; pp. 208-209.*

2002 Symposium on VLSI Technology, pp. 1-14, 2002.

Lee et al, Multi-Level Vertical Channel SONOS Nonvolatile Memory on SOI, pp. 208-209, 2002.

* cited by examiner

PROGRAM/ERASE TIME(sec)

PROGRAM/ERASE TIME(sec)

ENDURANCE CYCLING

ENDURANCE TIME(sec)

SILICON/OXIDE/NITRIDE/SILICON NONVOLATILE MEMORY WITH VERTICAL CHANNELS

BACKGROUND OF THE INVENTION

1. Field of the Invention

The present invention relates to a silicon/oxide/nitride/oxide/silicon (SONOS) memory, a fabricating method thereof, and a memory programming method. More particularly, the present invention relates to a SONOS memory having improved memory integration by controlling the width of a channel region, a fabricating method thereof, and a multilevel memory programming method.

2. Description of the Related Art

Data in a nonvolatile memory such as a flash memory can be electrically erased, programmed, and stored even when electric power is not supplied to the memory. Nonvolatile memory is being increasingly applied to various fields. Flash memory has advantages of both an erasable programmable read only memory (EPROM) and an electrically erasable programmable read only memory (EEPROM). Here, the EPROM has a reduced cell area due to being formed of one transistor, but data must be entirely erased using ultraviolet rays. Data in the EEPROM can be electrically erased, but the EEPROM has a large cell area due to being formed of two transistors. The flash memory, i.e., a flash EEPROM, is a device fabricated to perform the programming method of the EPROM and the erasing method of the EEPROM while including only one transistor.

Examples of a structure of a common flash memory include a NOR structure, in which cells are arranged between a bit line and ground in parallel, and a NAND structure, in which cells are arranged in series. The NOR nonvolatile memory cells and the NAND nonvolatile memory cells have advantages of high-integration and high-speed, respectively, and may thus be applied to techniques requiring these characteristics.

FIG. 1A illustrates a sectional view showing a structure of a conventional flash semiconductor memory. Referring to FIG. 1A, a flash memory having a floating gate structure is formed of a floating gate 17 for storing charges on a semiconductor substrate 11, an oxide/nitride/oxide (ONO) insulating layer 15 formed on the floating gate 17, and a control gate 13 stacked on the ONO insulating layer 15 for controlling the floating gate 17.

As capacities of memories increase and circuits become more complicated, an increased number of gate arrays and micro patterning techniques are required. The size of a conventional stacked gate type nonvolatile memory cell has been reduced; however, photolithography and etch methods for fabricating the memory cell have not followed this trend. In a memory device having a structure of a floating gate for storing charges and a control gate stacked thereon, it is difficult to pattern the memory device due to a high step difference compared to a micro plane size.

FIG. 1B illustrates a sectional view of a conventional stacked gate type nonvolatile memory cell with a floating gate. More specifically, FIG. 1B illustrates a sectional view of a metal/oxide/nitride/oxide/silicon (MONOS) nonvolatile cell of a single gate structure, such as a MOSFET structure. Referring to FIG. 1B, the MONOS cell, or a SONOS cell, uses an ONO insulating layer 25 between a substrate 21 and a control gate 23, instead of a gate oxide, where the ONO insulating layer 25 is substituted for a floating gate. Consequently, silicon nitride (SiN) is formed between thin oxide layers to charge or discharge electrodes to or from the SiN. Here, a thickness of the ONO insulating layer 25 is smaller than 100 to 200 Å, which does not increase the step difference. Thus, it is possible to form the memory cell having a reduced size by a photolithography method, and the structure does not require additional processes related to a floating gate.

A SONOS type memory without a floating gate has been developed by Nisshin Seifun Group Inc. and AMD. Inc. for several years to attain a highly integrated nonvolatile memory (NVM) device. An integration density of a 2-bit memory using an asymmetry programming method is twice that of a stacked gate type flash memory.

FIG. 2A is a graph illustrating changes in threshold voltages $V_T$ according to changes in voltages $V_{DS}$ between source and drain electrodes in a 2-bit memory using an asymmetry programming method. FIG. 2B illustrates a sectional view of a 2-bit memory corresponding to line graph f1 of FIG. 2A, and FIG. 2C illustrates a sectional view of a 2-bit memory corresponding to line graph f2 of FIG. 2A.

The same 2-bit memory is illustrated in FIGS. 2B and 2C; however, FIG. 2B illustrates the 2-bit memory in a forward reading method, and FIG. 2C illustrates the 2-bit memory in a reverse reading method, both of which are described below.

Referring to FIGS. 2B and 2C, a high voltage, or programming voltage, may be applied to either a junction between a transistor type control gate 33 and a source electrode 32 or a junction between the control gate 33 and a drain electrode 34. Thereafter, electrons are injected into a channel formed in SiN at a lower edge of the control gate 33, which is adjacent to the source electrode 32 or the drain electrode 34, using a channel hot electron injection (CHEI) method. A voltage is applied to the other junction to read data in a reverse method.

Referring to FIGS. 2A and 2B, the line graph f1 illustrates a relationship between the voltage $V_{DS}$ between the source and drain electrodes 32, 34 and the threshold voltage $V_T$ in a forward reading method, where voltage is applied in a reading operation to the junction to which the high voltage, or programming voltage, has been applied. FIG. 2B illustrates a channel, wherein electrons trapped in the SiN exist in an upper portion of the channel at an end of the channel adjacent to the electrode to which the voltage is not applied. In FIG. 2B, since the voltage is applied to the source electrode 32, electrons are trapped in the SiN at an end of the channel adjacent the drain electrode 34. FIG. 2B illustrates low threshold voltage characteristics.

Referring to FIG. 2A, the line graph f2 illustrates a relationship between the voltage $V_{DS}$ between the source and drain electrodes 32, 34 and the threshold voltage $V_T$ in a reverse reading method, where a voltage is applied to a junction other than a junction to which the programming voltage has been applied. Here, FIG. 2C illustrates a channel, wherein electrons trapped in the SiN exist at an upper portion of the channel adjacent to the electrode to which the voltage has been applied, in this case the drain electrode 34. FIG. 2C illustrates a high threshold voltage $V_T$ in a programming state.

Such 2-bit memory has the advantages of reducing process costs by not increasing the integration of the conventional semiconductor memory and using relatively simple processes. However, it is difficult to obtain stable 2-bit memory characteristics due to the horizontal distribution of charges, which are trapped by an asymmetry storing method, and due to storage of the charges when using the device.

In addition, in the conventional SONOS type flash memory, a width of the channels is reduced to improve the integration of the memory; however, it is difficult to improve the integration due to technical limitations in semiconductor device manufacturing processes.

FIG. 3 illustrates a schematic sectional view of a conventional programming method for an EEPROM. A programming voltage $V_{PP}$ is applied to a gate electrode 57, and a source electrode 53, a drain electrode 55, and a P-bulk 51 are grounded by a metal contact method. Accordingly, electrons are transferred from the P-bulk 51 to a tunnel oxide layer 54 by Fowler-Nordheim tunneling, and are captured in a nitride layer 56 serving as a floating gate. In this way, the memory cell is programmed. Here, reference numeral 58 denotes an ONO layer.

FIGS. 4A and 4B illustrate a conventional erasing method for an EEPROM.

Referring to FIG. 4A, a negative programming voltage $-V_{pp}$ is applied to a gate electrode 67, and a source electrode 63, a drain electrode 65, and a P-bulk 61 are grounded as in the case of the programming method. Holes are injected from the P-bulk 61 to a tunnel oxide layer 64 and electrons captured in a nitride layer 66 serving as a floating gate are compensated. Therefore, the memory cell is erased. Here, reference numeral 68 denotes an ONO layer.

FIG. 4B illustrates another conventional erasing method for an EEPROM. Here, the method of FIG. 4B forms a pocket well and applies a voltage to the pocket well instead of applying a negative voltage to a gate electrode.

Referring to FIG. 4B, a pocket p-well 71b is formed in an n-type bulk 71. In this case, a gate electrode 77 is grounded while an erasing voltage $V_{PP}$ is applied to a source electrode 73, a drain electrode 75, the pocket p-well 71b, and the n-type well 71a by a metal contact method. Accordingly, charges stored in a nitride layer 76 are erased. In FIG. 4B, reference numeral 74 denotes a tunnel oxide layer and reference numeral 78 denotes an ONO layer.

The differences between the programming and erasing methods in the floating gate flash memory and the SONOS flash memory are as follows. Since the floating gate is formed of conductive polymers, a specific voltage is applied to the floating gate according to a voltage condition, and electrons and holes are injected to the floating gate according to the potential difference between the voltage applied to the floating gate and a bulk or source electrode. Thus, charges move substantially between a substrate and the floating gate.

However, since the ONO layer is formed of a nonconductive material, the voltage, which is applied according to a thickness ratio of the nitride layer or the oxide layer of the ONO layer, is distributed between the gate and the nitride layer, or between the nitride layer and the silicon substrate. Thus, electrons or holes may be injected from the silicon substrate, and holes or electrons may be reversely injected from the gate, so that programming and erasing efficiencies may be reduced. In particular, in a case where a positive voltage is applied to the gate electrode in a programming process and electrons are injected from the substrate, holes are unlikely to be reversely injected from the n-type gate electrode. However, in a case where a negative voltage is applied to the gate electrode in an erasing process and holes are injected from the substrate, electrons are likely to be reversely injected from the n-type gate electrode thereby decreasing the erasing efficiency.

SUMMARY OF THE INVENTION

In an effort to solve these and other problems, it is a feature of an embodiment of the present invention to provide a silicon/oxide/nitride/oxide/silicon (SONOS) flash memory having high integration by using a novel structure, and a fabricating method thereof.

It is another feature of an embodiment of the present invention to provide a multi-level programming method for realizing a high capacity in a memory having a general degree of integration by improving programming and erasing efficiencies.

According to a feature of an embodiment of the present invention, there is provided a SONOS memory with vertical channels including a substrate, a first insulating layer stacked on the substrate, a semiconductor layer, which is patterned on the first insulating layer in a predetermined shape, including source and drain electrodes separated by a predetermined interval, such that a portion of the semiconductor layer is positioned between the source and drain electrodes, a second insulating layer located on the semiconductor layer between the source and drain electrodes, a memory layer, which is deposited on sides of the portion of the semiconductor layer positioned between the source and drain electrodes and on sides and an upper surface of the second insulating layer, the memory layer including electron transferring channels and an electron storing layer, and a gate electrode, which is deposited on a surface of the memory layer, for controlling transfer of electrons in the memory layer.

Preferably, if the substrate is formed of an n-type semiconductor, the gate electrode is formed of a p-type semiconductor, and if the substrate is formed of a p-type semiconductor, the gate electrode is formed of an n-type semiconductor.

The memory layer may include a third insulating layer formed on the portion of the semiconductor layer between the source and drain electrodes, the electron storing layer deposited on an upper surface of the third insulating layer and the sides and the upper surface of the second insulating layer, and a fourth insulating layer formed on an upper surface of the electron storing layer.

Any of the first through fourth insulating layers may be formed of silicon oxide, and the electron storing layer may be formed of silicon nitride.

The SONOS memory may further include W-contacts, which are formed on the upper surface of the semiconductor layer, for electrically contacting to the source and drain electrodes, respectively. In addition, the SONOS memory may further include pad electrodes, which are preferably formed on upper surfaces of the W-contacts, for electrically connecting the W-contacts to a power supply.

The semiconductor layer may be formed of a first portion extending in a first direction and second portions extending in a second direction, which is perpendicular to the first direction, at left and right ends of the first portion.

According to another feature of an embodiment of the present invention, there is provided a method of fabricating a SONOS memory with vertical channels, the method including a first act of successively stacking a first insulating layer and a semiconductor layer on a substrate, and controlling a thickness of the semiconductor layer by oxidizing the semiconductor layer and etching a predetermined thickness of the semiconductor layer, a second act of depositing a second insulating layer on the semiconductor layer and performing a photolithography process on the semiconductor layer and the second insulating layer to pattern the semiconductor layer and the second insulating layer into a predetermined shape, a third act of forming a memory layer including electron transferring channels and an electron storing layer on the first and second insulating layers, depositing a gate electrode layer on the memory layer, and performing a photolithography process on the memory layer and the gate electrode layer to pattern a gate electrode and the memory layer into a stripe shape in order to expose the second insulating layer at sides of the gate electrode and the memory layer, and a fourth act of etching the resultant structure except for the second insulating layer located under the memory layer by using the gate electrode as a mask, and implanting ions to the exposed semiconductor layer to form source and drain electrodes.

In the second act, the semiconductor layer may be formed of a first portion extending in a first direction and second portions extending in a second direction, which is perpendicular to the first direction, at left and right ends of the first portion.

The third act may include forming the memory layer on the first and second insulating layers and performing an annealing process on the memory layer, and depositing the gate electrode on the memory layer and heavily doping ions to the gate electrode.

In addition, the fourth act may include lightly doping ions to portions of the semiconductor layer at sides of the second insulating layer to form a vertical junction and a silicon top junction on the semiconductor layer, lightly doping ions to the semiconductor layer to form the source and drain electrodes, depositing a sacrificial layer on the first insulating layer, the semiconductor layer, and the gate electrode and performing a photolithography process on the sacrificial layer to pattern the sacrificial layer for coating portions of the source and drain electrodes, and heavily doping ions to the semiconductor layer to form junctions of the source and drain electrodes.

The method may further include a fifth act of coating a third insulating layer on the first insulating layer and the semiconductor layer, forming holes in the third insulating layer to the source and drain electrodes, and filling a metal material in the holes to form column-shape W-contacts on the semiconductor layer.

After the fifth act, the method may further include a sixth act of forming pad electrodes on the third insulating layer to apply a power supply to the W-contacts.

Here, the memory layer may include a third insulating layer formed on a portion of the semiconductor layer located between the source and drain electrodes, the electron storing layer deposited on an upper surface of the third insulating layer and sides and an upper surface of the second insulating layer, and a fourth insulating layer formed on an upper surface of the electron storing layer.

Here, any of the first through fourth insulating layers may be formed of silicon oxide, and the electron storing layer may be formed of silicon nitride.

According to another feature of an embodiment of the present invention, there is provided a method of programming a memory including a substrate and a gate electrode, wherein the programming method is performed by establishing a saturation gate voltage where a gate voltage applied to the gate electrode for erasing data is assigned a data value. Here, the saturation gate voltage is formed as a multi-level voltage.

Preferably, when the substrate is formed of a p-type semiconductor, the gate electrode is formed of an n-type semiconductor, and when the substrate is formed of an n-type semiconductor, the gate electrode is formed of a p-type semiconductor.

Here, the memory may be a flash memory of a floating gate type or a SONOS memory.

In addition, the memory may be the SONOS memory with vertical channels according to the present invention, as previously described.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE INVENTION

Figure 1A:
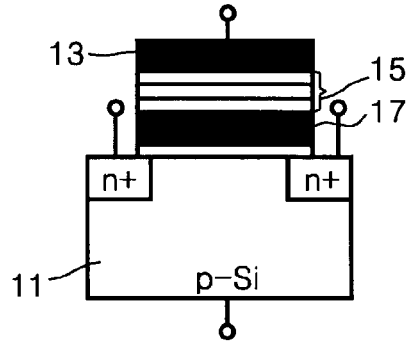
FIG. 1A illustrates a sectional view showing the structure of a conventional flash memory.
Figure 1B:
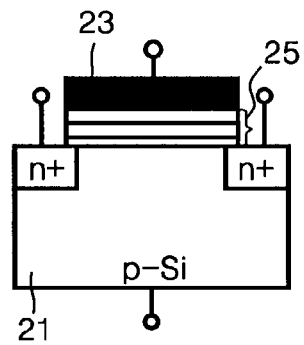
FIG. 1B illustrates a sectional view showing the structure of a conventional silicon/oxide/nitride/oxide/silicon (SONOS) memory.
Figure 2A:
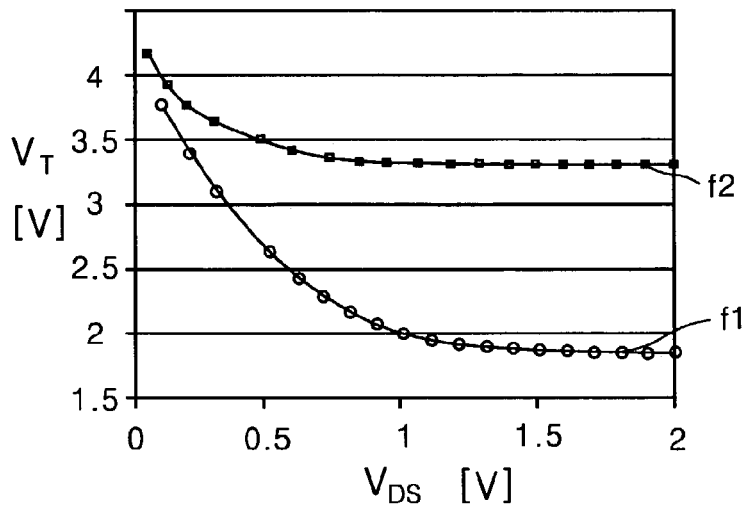
FIG. 2A is a graph illustrating changes in threshold voltages $V_T$ according to changes in voltages $V_{DS}$ between source and drain electrodes in a 2-bit memory using an asymmetric programming method.
Figure 2B:
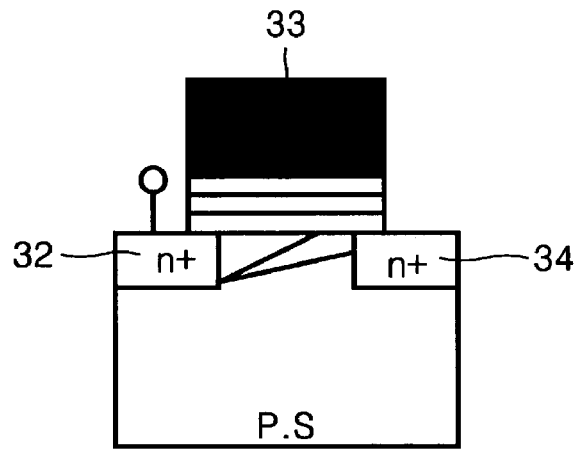
FIG. 2B illustrates a sectional view showing a memory corresponding to the line graph f1 of FIG. 2A.
Figure 2C:
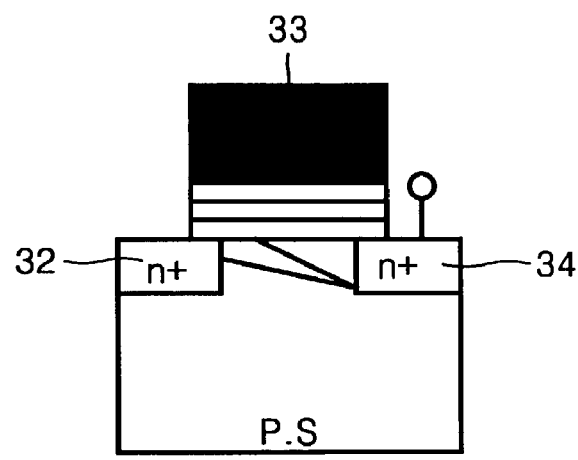
FIG. 2C illustrates a sectional view showing a memory corresponding to the line graph f2 of FIG. 2A.
Figure 3:
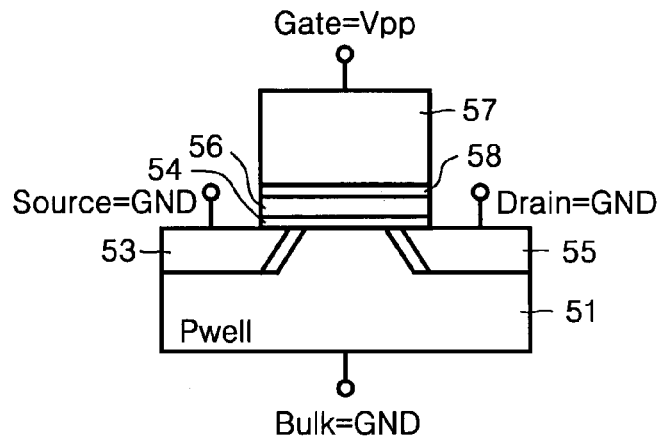
FIG. 3 illustrates a conventional programming method in an electrically erasable programmable read only memory (EEPROM) device.
Figure 4A:
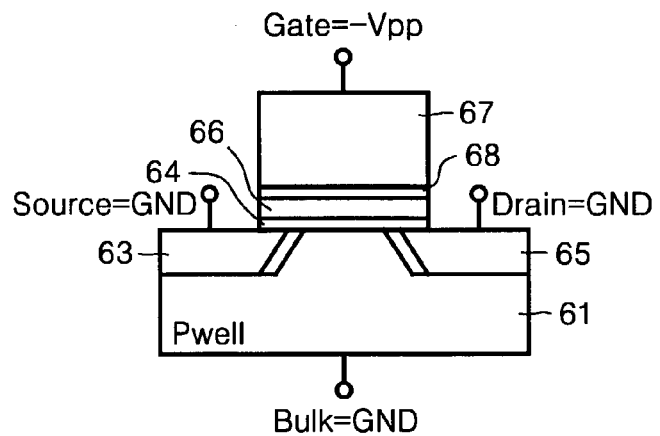
FIGS. 4A and 4B illustrate conventional erasing methods in an EEPROM.
Figure 4B:
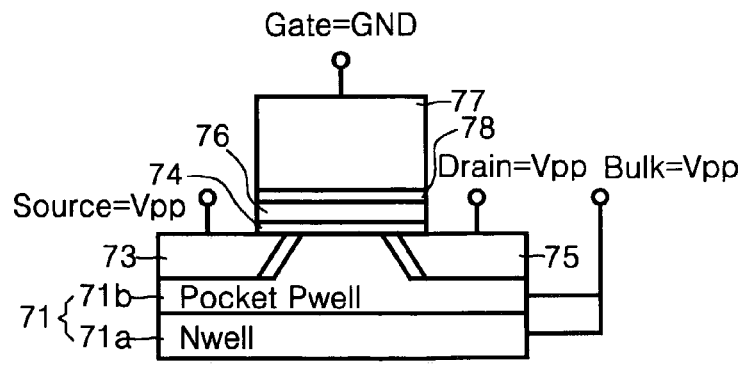

Korean Patent Application No. 2002-71042, filed on Nov. 15, 2002, and entitled: "Silicon/Oxide/Nitride/Oxide/Silicon Nonvolatile Memory With Vertical Channels, Fabricating Method Thereof, And Programming Method Thereof," is incorporated by reference herein in its entirety.

The present invention will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 5:
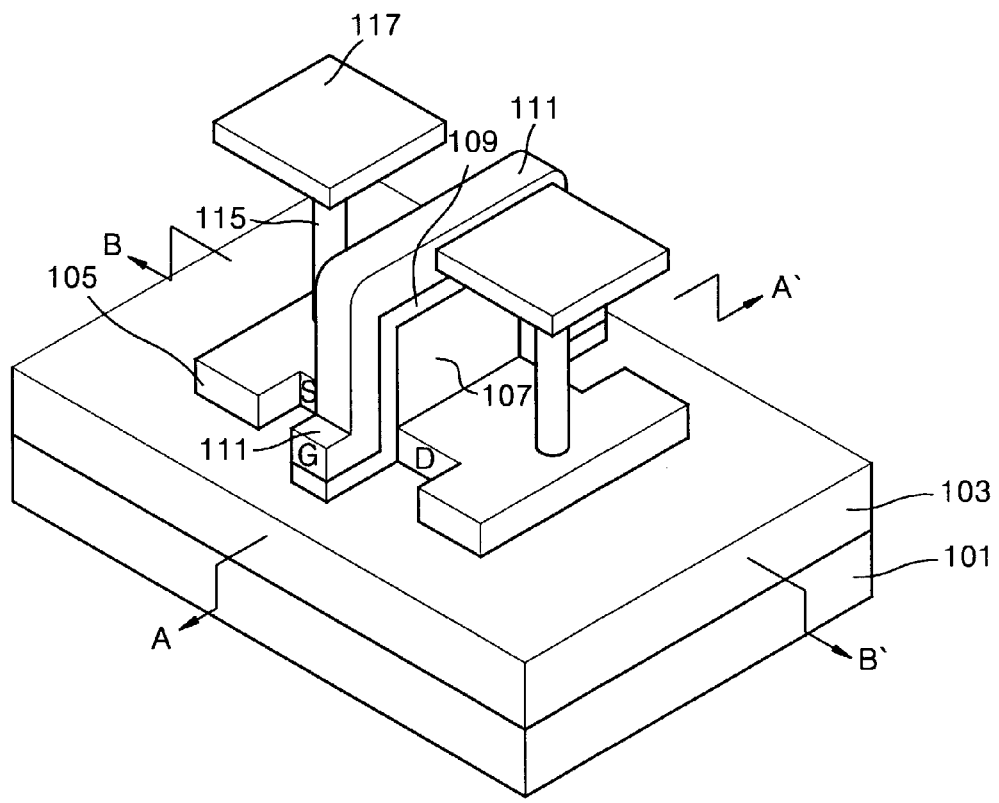
FIG. 5 illustrates a perspective view showing a SONOS memory with vertical channels according to the present invention.

FIG. 5 illustrates a perspective view showing a silicon/oxide/nitride/oxide/silicon (SONOS) memory with vertical channels according to the present invention.

Referring to FIG. 5, a first insulating layer 103 is deposited on an upper surface of a substrate 101, and a semiconductor layer 105 is patterned on the first insulating layer 103. Here, the semiconductor layer 105 is formed of a first portion extending in a first direction and second portions extending in a second direction, which is perpendicular to the first direction, formed at left and right ends of the first portion. The semiconductor layer 105 includes a source electrode S and a drain electrode D, and two W-contacts 115 in a column shape erected on upper surfaces of the source and drain electrodes S and D. Pad electrodes 117 are formed on the W-contacts 115 to connect an external power supply (not shown) to the source and drain electrodes S and D. A stripe-type second insulating layer 107 is formed on the first portion of the semiconductor layer 105 between the source and drain electrodes S and D, and a memory layer 109 is deposited to surround an upper surface of the second insulating layer 107 and sides of the semiconductor layer 105 and to extend to a surface of the first insulating layer 103. Thereafter, a gate electrode 111 (G) is formed on the memory layer 109.

When the substrate 101 is a p-type substrate, the gate electrode 111 (G) is an n-type gate electrode, and when the substrate 101 is an n-type substrate, the gate electrode 111 (G) is a p-type gate electrode. The first and second insulating layers 103 and 107 are preferably formed of silicon oxide, and the semiconductor layer 105 is preferably formed of silicon. In addition, the memory layer 109 is preferably formed of an oxide/nitride/oxide (ONO) layer.

Figure 6A:
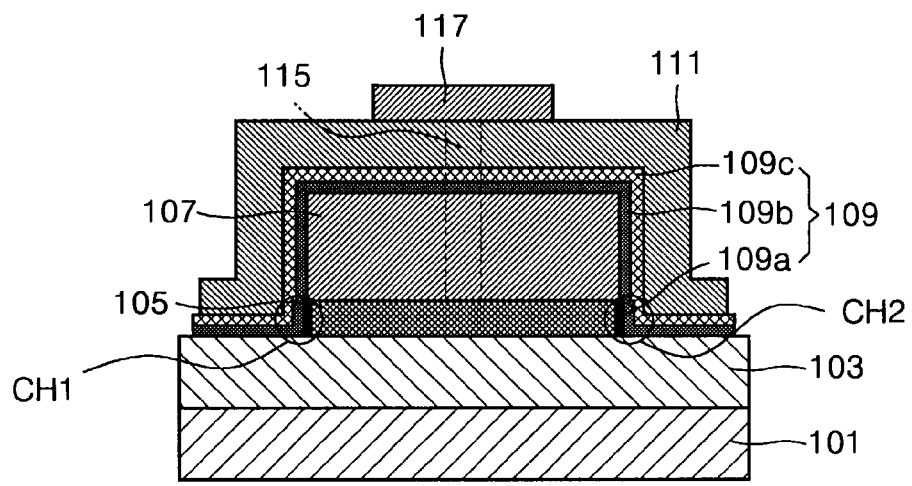
FIG. 6A illustrates a sectional view of the SONOS memory of FIG. 5 along the line A-A'.
Figure 6B:
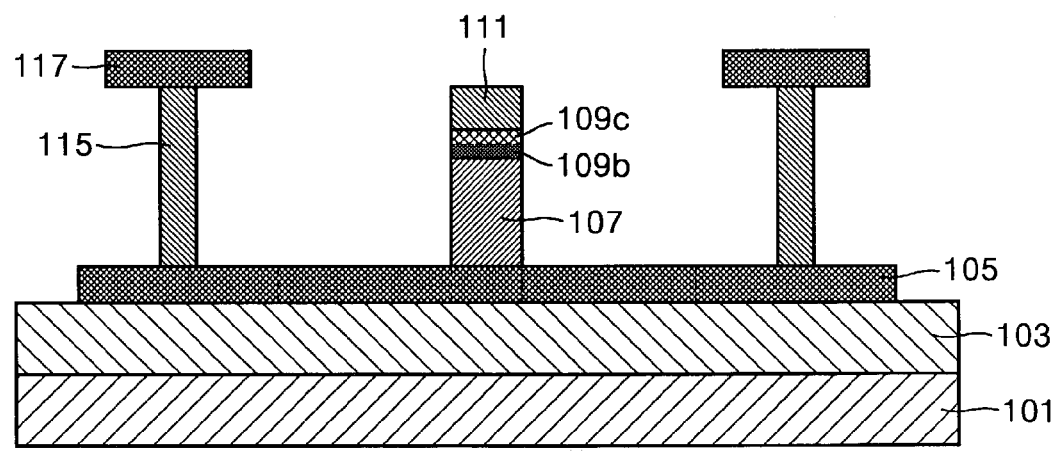
FIG. 6B illustrates a sectional view of the SONOS memory of FIG. 5 along the line B-B'.

FIG. 6A illustrates a sectional view of the SONOS memory of FIG. 5 along the line A-A', and FIG. 6B illustrates a sectional view of the SONOS memory of FIG. 5 along the line B-B'.

Referring to FIG. 6A, a first insulating layer 103 is stacked on a substrate 101, a semiconductor layer 105 is formed on the first insulating layer 103 to occupy a predetermined area, and a second insulating layer 107 is patterned on the semiconductor layer 105. A memory layer 109 formed of an ONO layer is deposited on sides of the semiconductor layer 105 and an upper surface and sides of the second insulating layer 107 while having channel regions CH1 and CH2 on the sides of the semiconductor layer 105.

Memory layer 109 is formed of a first oxide layer 109a formed on the sides of the semiconductor layer 105, a nitride layer 109b deposited on a surface of the first oxide layer 109a and the sides and the upper surface of the second insulating layer 107, and a second oxide layer 109c deposited on an upper surface and sides of the nitride layer 109b. A conductive layer is deposited on the second oxide layer 109c to form the gate electrode 111 (G). Here, the first and second oxide layers 109a and 109c perform as insulating layers, and the nitride layer 109b stores electrons. The electrons may be stored on interfaces of the nitride layer 109b and the first and second oxide layers 109a and 109c. The second insulating layer 107 and the first and second oxide layers 109a and 109c may be formed of silicon oxide.

Referring to FIG. 6B, the first insulating layer 103 is formed on the substrate 101, and the semiconductor layer 105 having a predetermined area is formed on the first insulating layer 103. The second insulating layer 107 is located at a central portion of the semiconductor layer 105, and the nitride layer 109b and the second oxide layer 109c are located on the upper surface of the second insulating layer 107. In addition, the gate electrode 111 (G) is formed on the second oxide layer 109c. W-contacts 115 are arranged on the source and drain electrodes S and D of the semiconductor layer 105, and pad electrodes 117 are formed on the W-contacts 115 to connect an external power supply (not shown) to the memory cell.

Figure 7A:
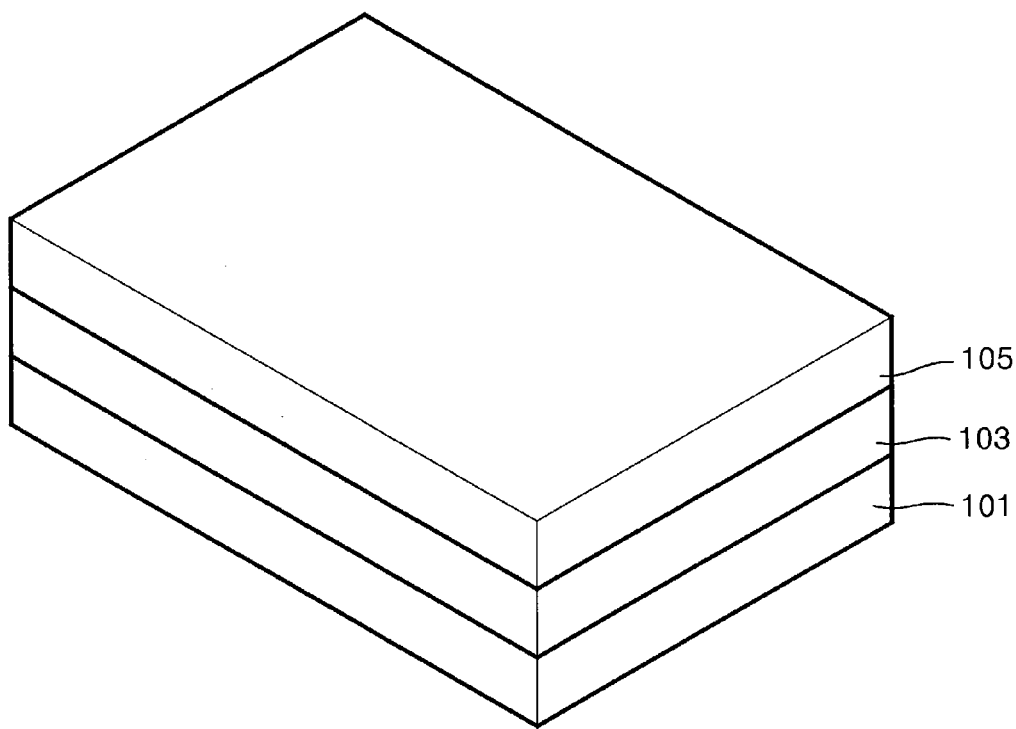
FIGS. 7A through 7P illustrate a fabricating method of a SONOS memory according to the present invention.
Figure 7B:
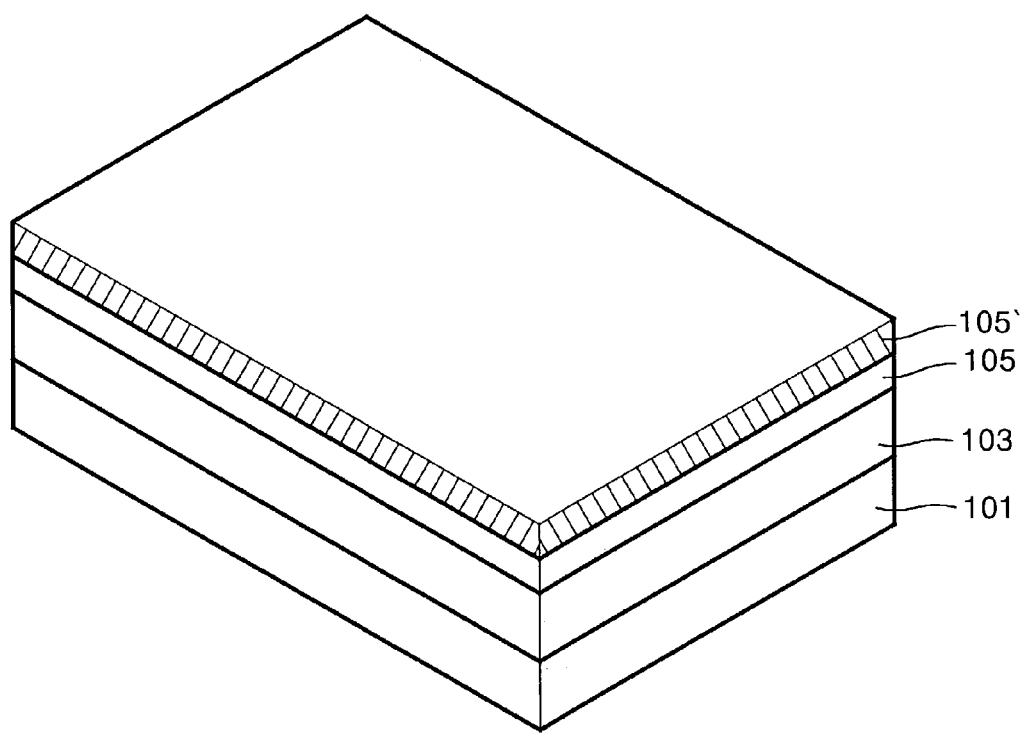
Figure 7C:
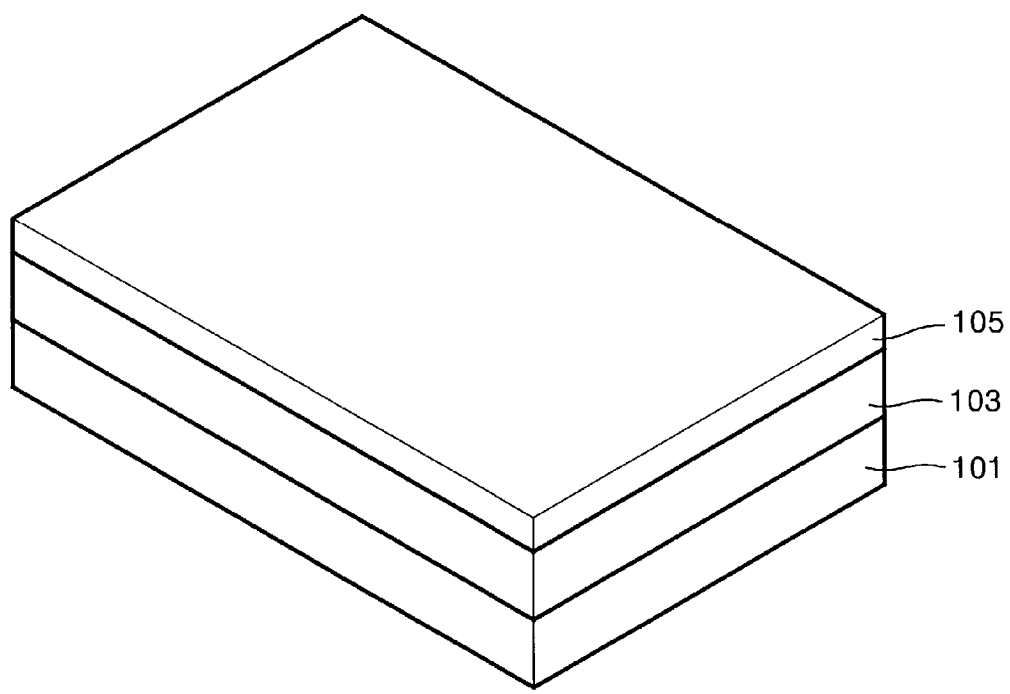
Figure 7D:
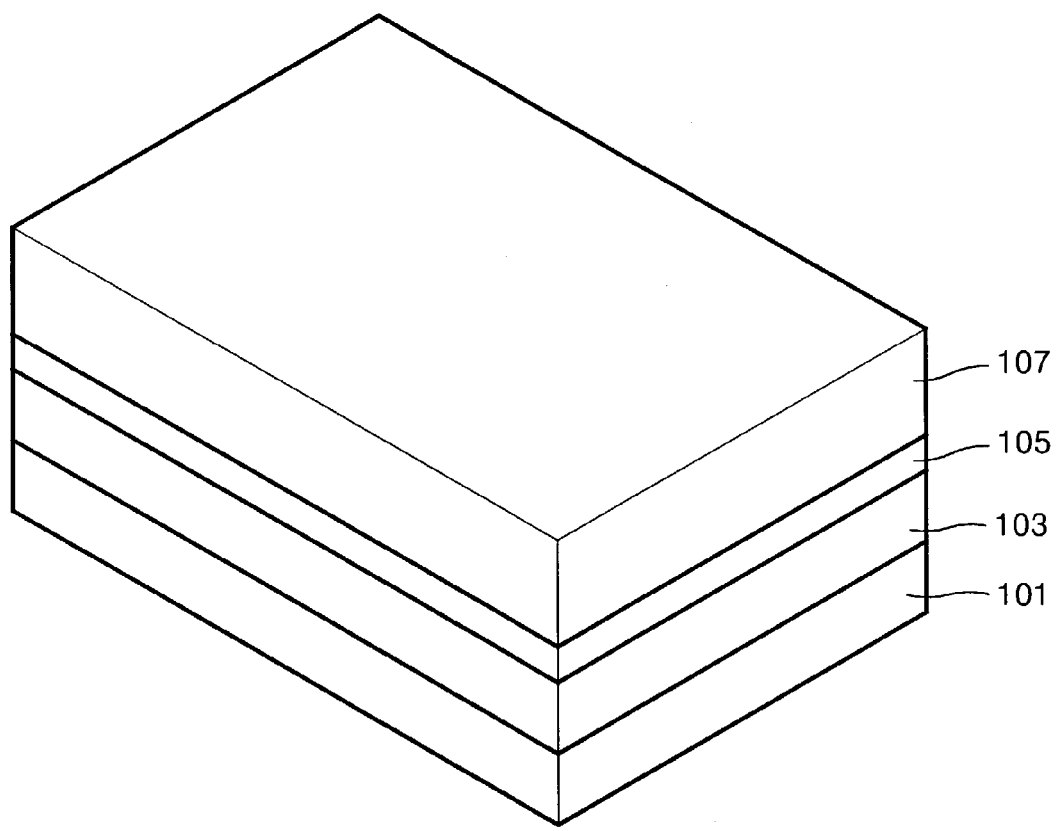
Figure 7E:
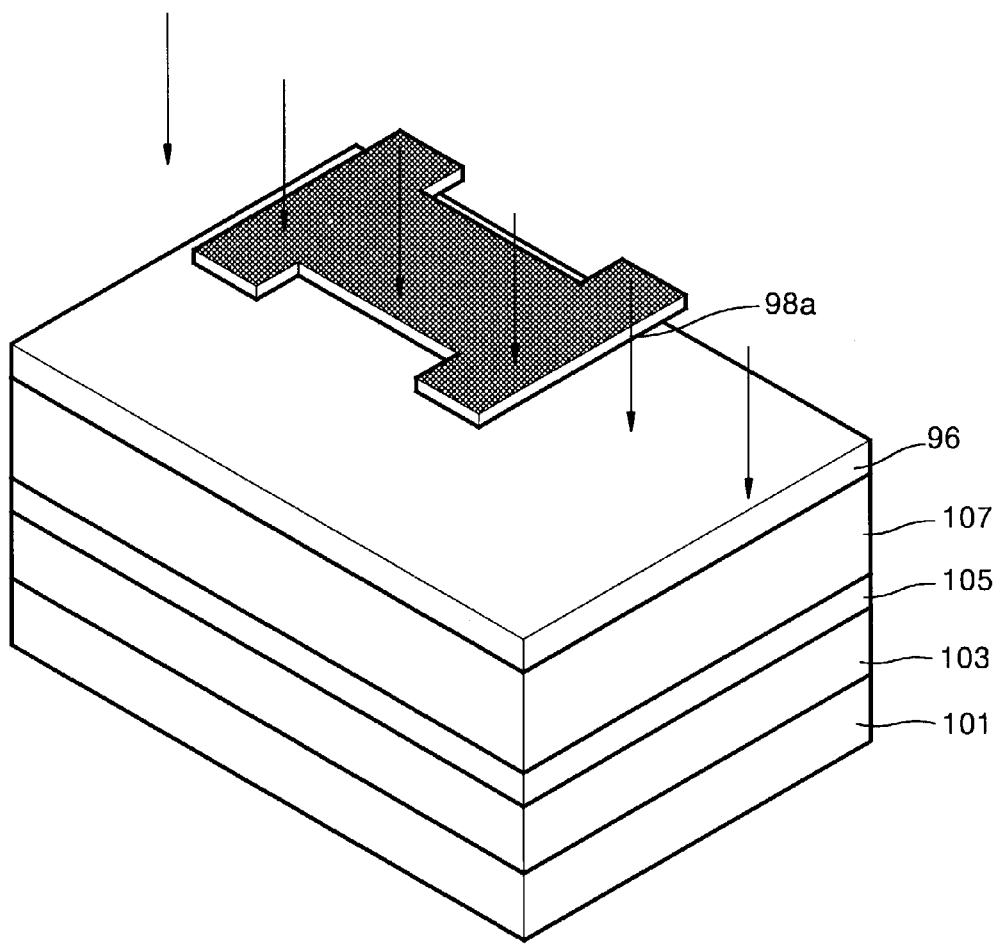
Figure 7F:
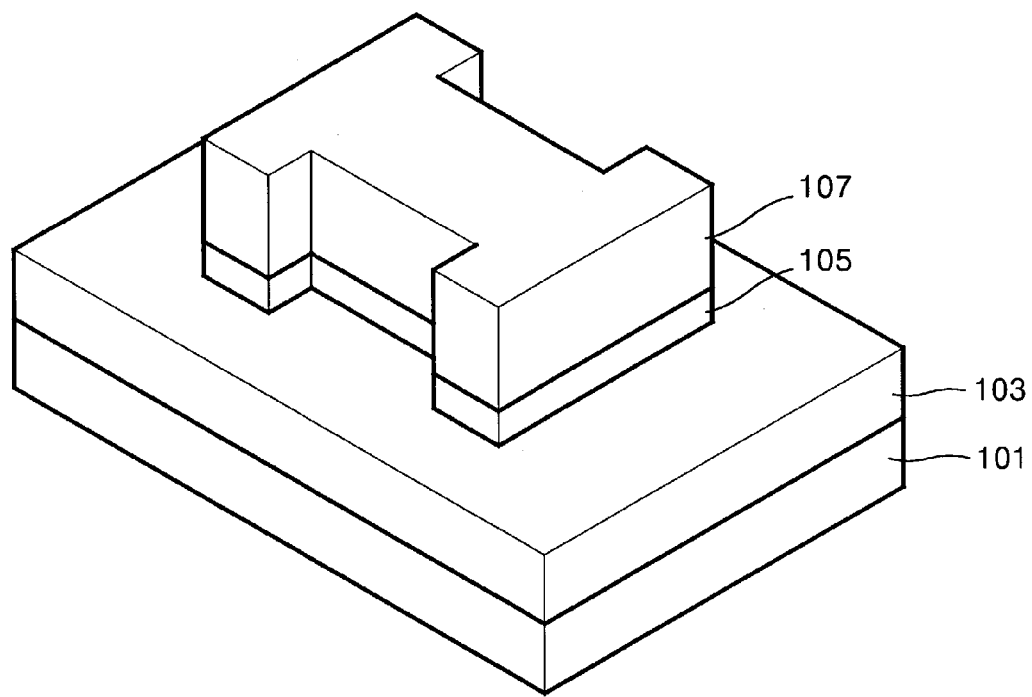
Figure 7G:
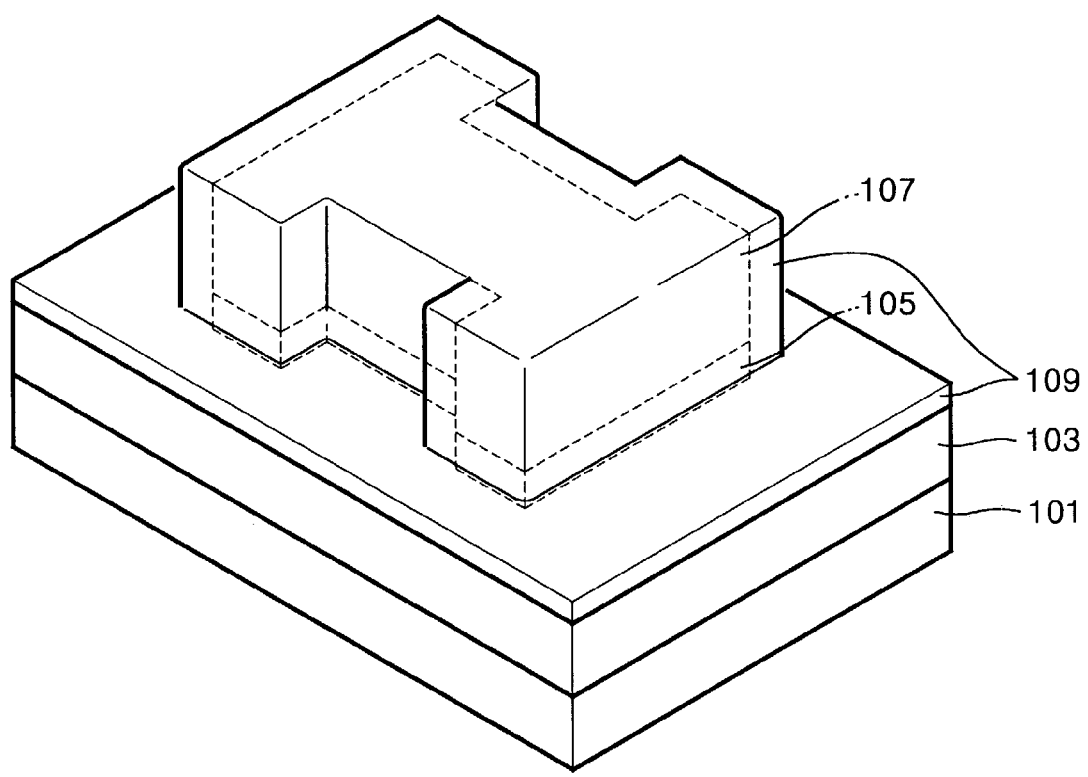
Figure 7H:
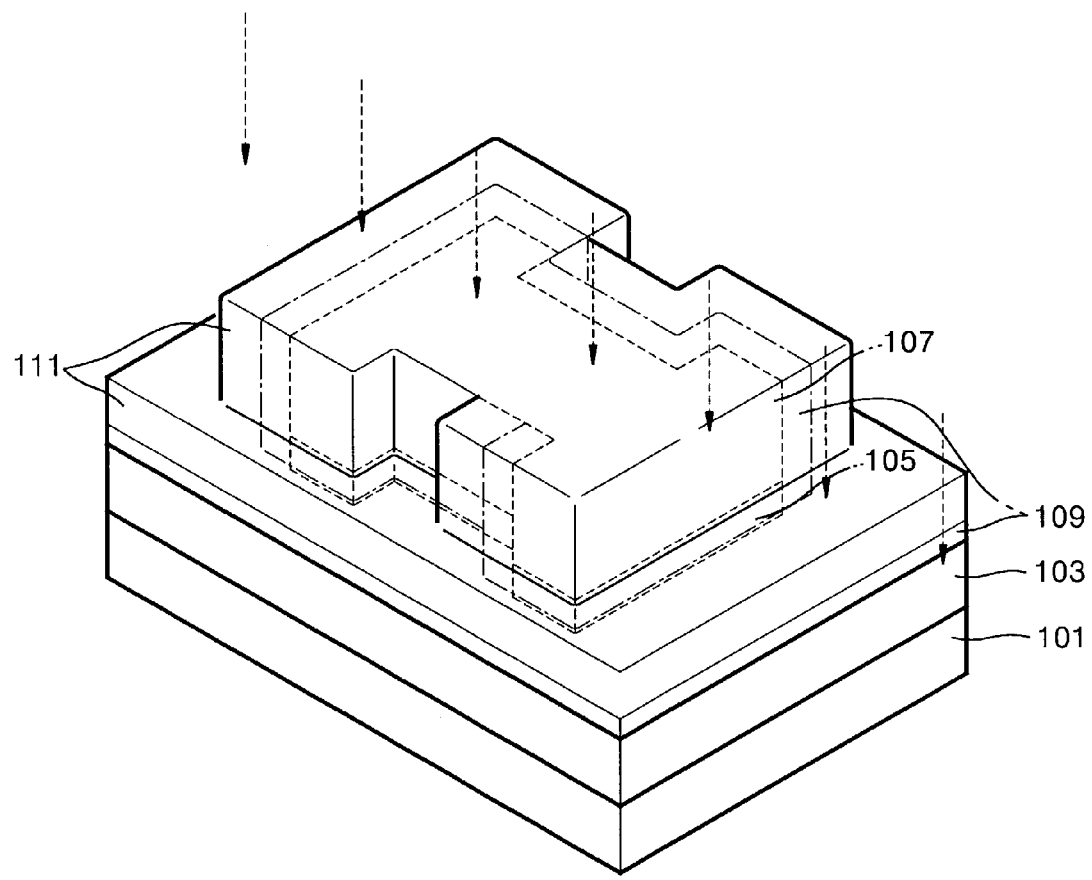
Figure 7I:
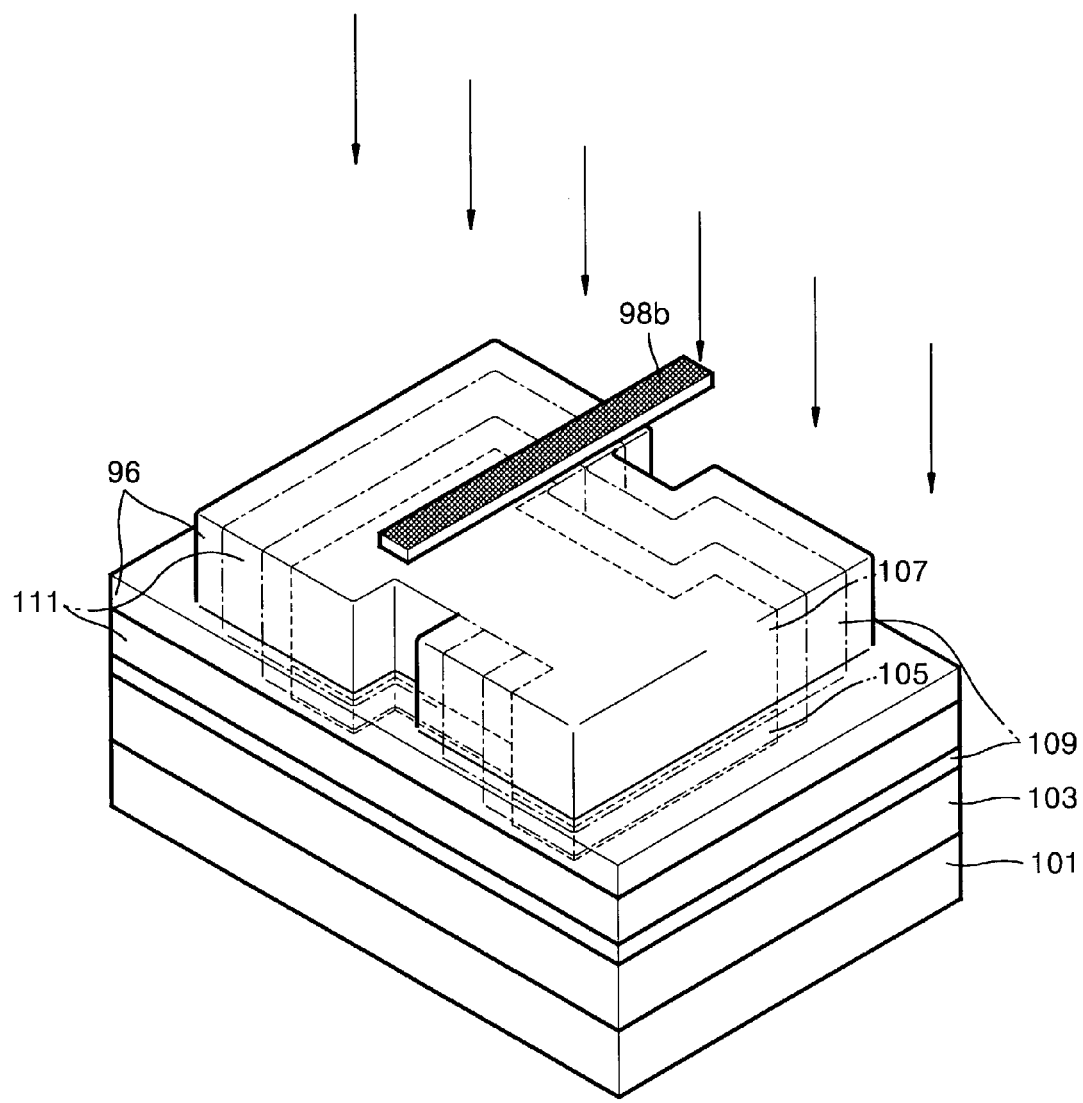
Figure 7J:
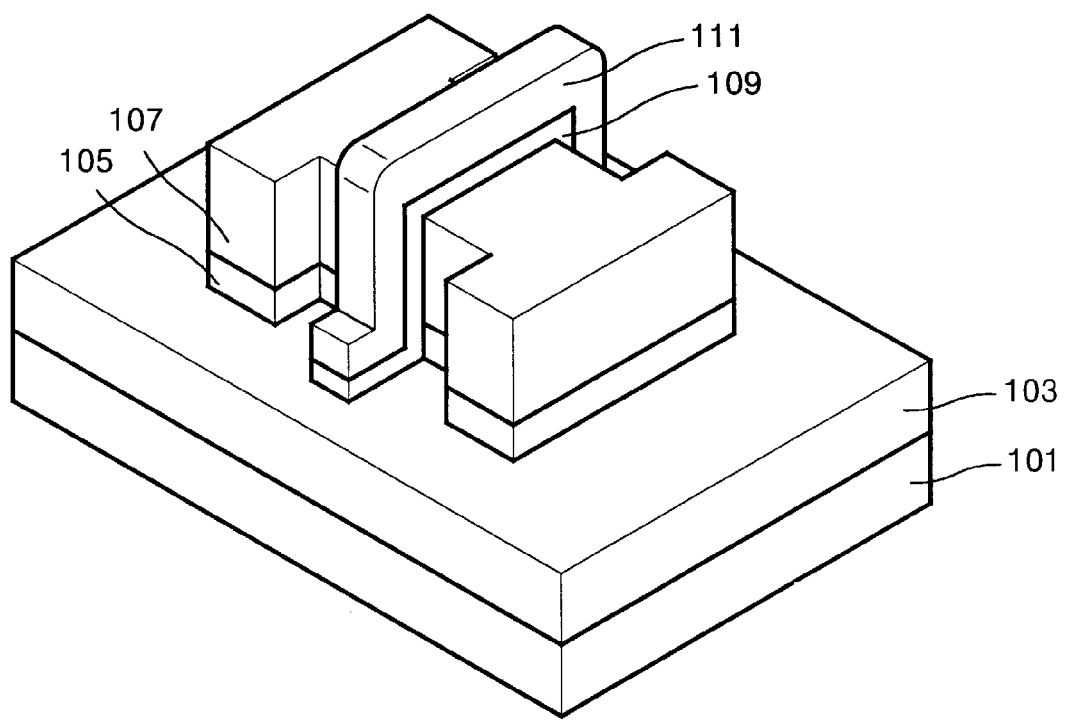
Figure 7K:
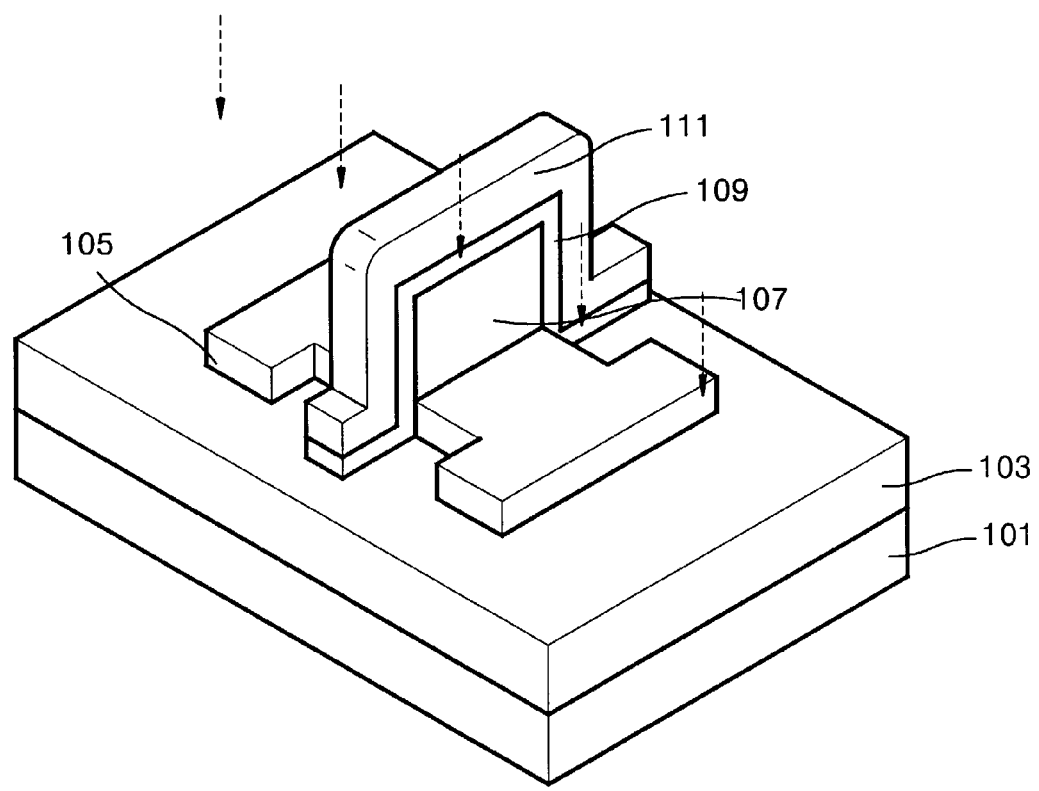
Figure 7L:
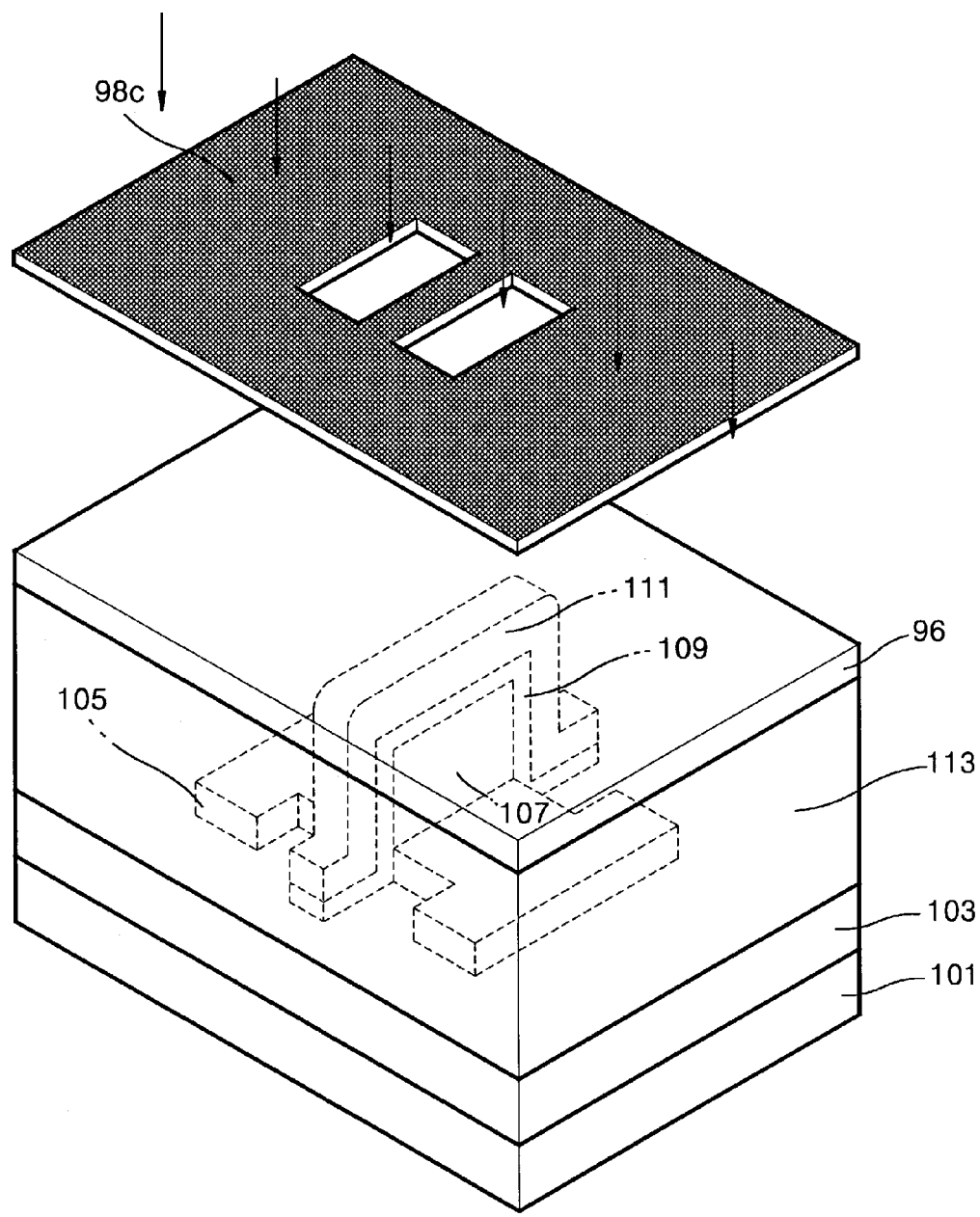
Figure 7M:
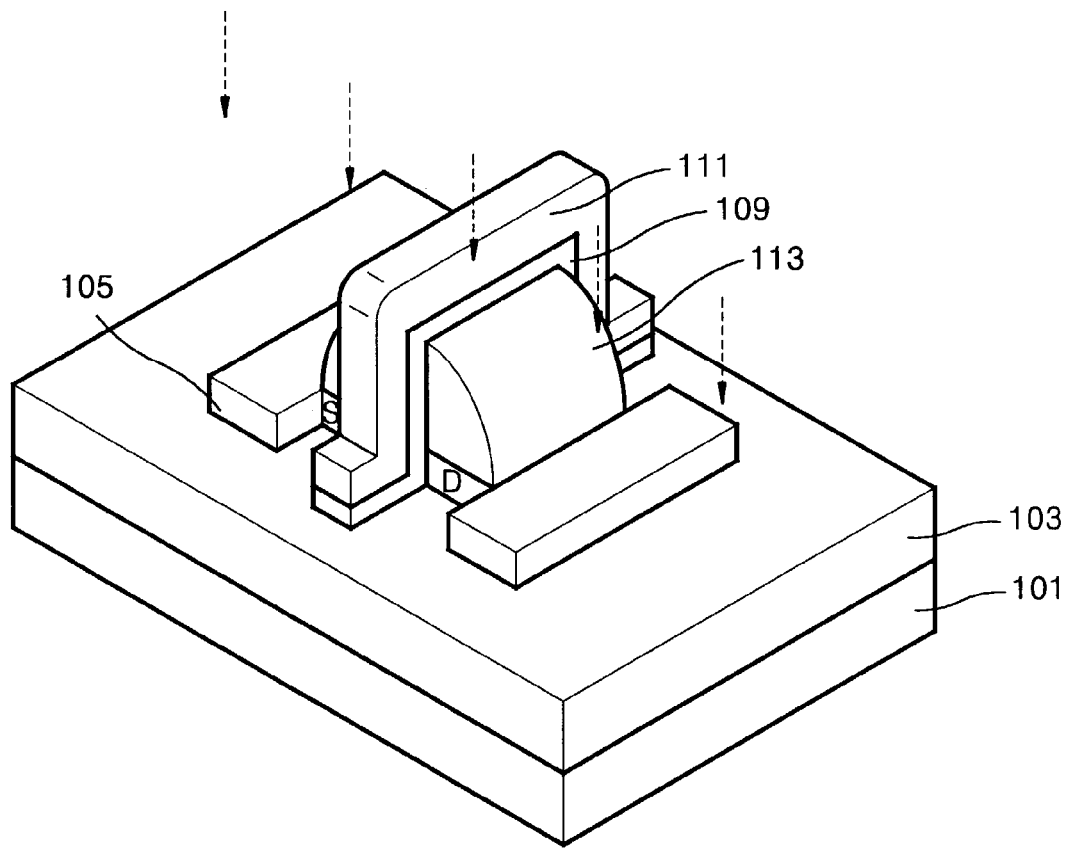
Figure 7N:
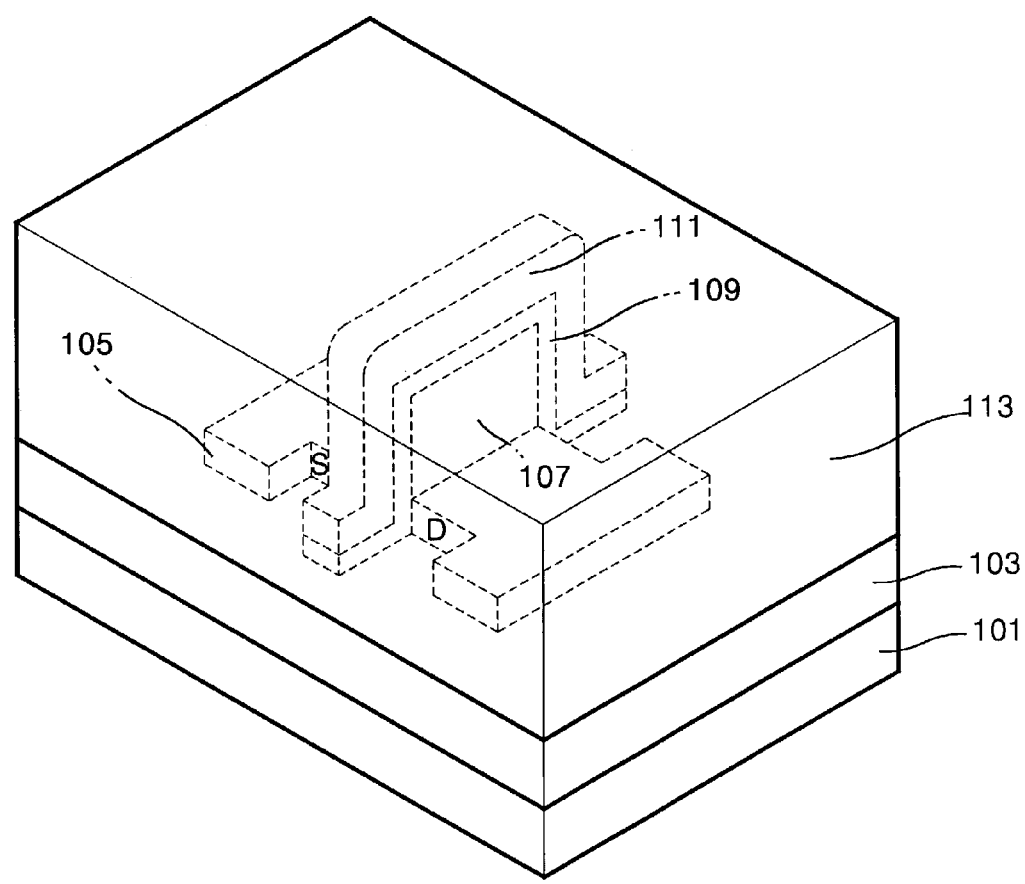
Figure 70:
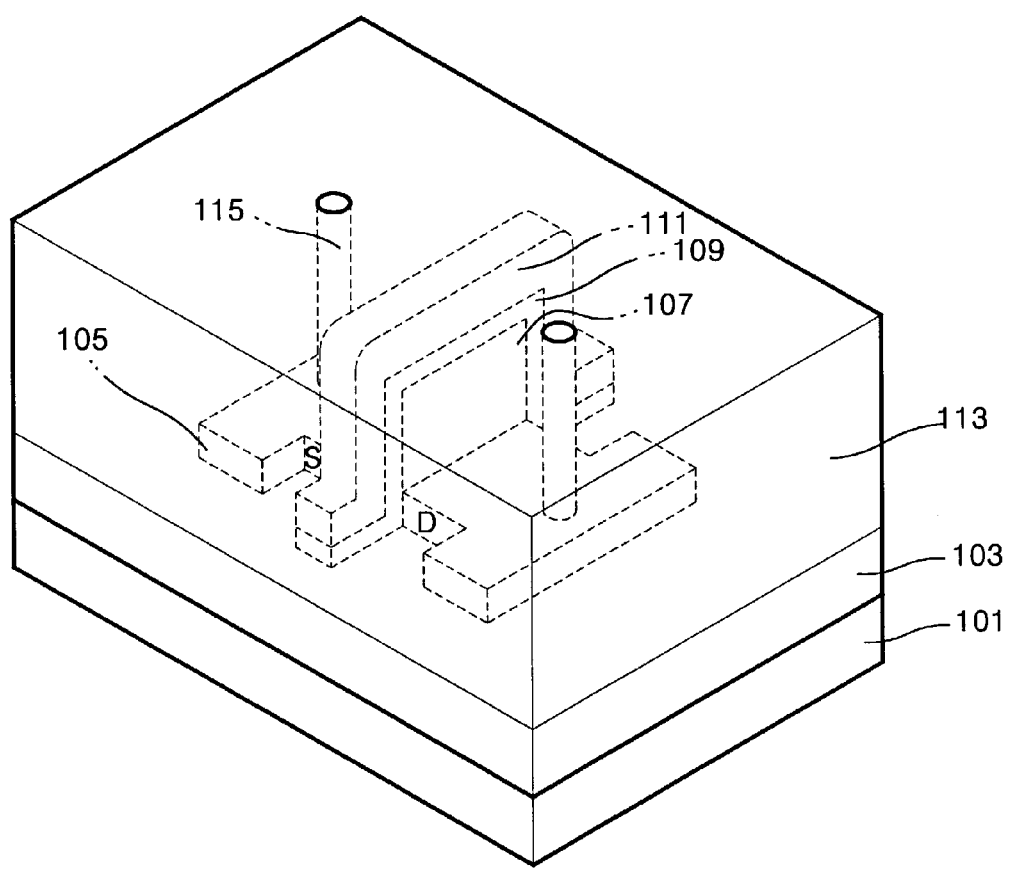
Figure 7P:
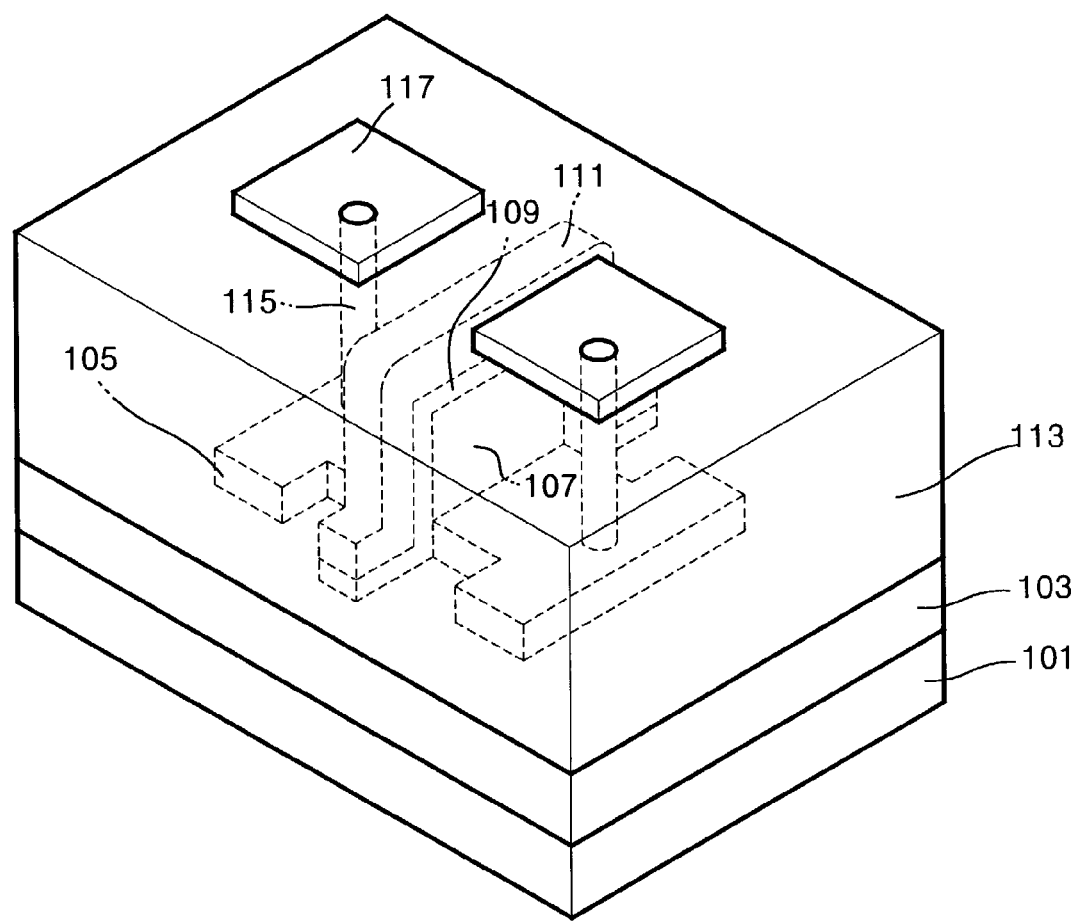

FIGS. 7A through 7P illustrate a fabricating method of the SONOS memory according to the present invention.

Referring to FIG. 7A, a silicon oxide insulator (SOI) layer formed of a semiconductor layer 105 of silicon and a first insulating layer 103 of oxide is deposited on a substrate 101. In FIG. 7B, in order to determine a width of vertical active channels of the semiconductor layer 105, which will be used as the channels of the device, the semiconductor layer 105 of the SOI layer is wet oxidized to convert a predetermined thickness of the semiconductor layer 105 into an oxide layer 105'. When the oxide layer 105' is removed by a wet etching method, a stack structure of the substrate 101, the first insulating layer 103, and the semiconductor layer 105 with a reduced thickness is formed as shown in FIG. 7C.

Referring to FIG. 7D, a second insulating layer 107 is deposited on the stack structure using a chemical vapor deposition (CVD) method in order to reduce a surface channel current of the semiconductor layer 105 in regions other than a vertical region of the semiconductor layer 105, which will be used as the active channels. Here, a thickness of the second insulating layer 107 is determined by performing simulations to control an amount of current flowing to a surface channel to be smaller than an amount of current flowing to a vertical active channel of the SOI layer.

Referring to FIG. 7E, a photolithography process is performed to pattern the semiconductor layer 105 and the second insulating layer 107. Here, a photoresist layer 96 is deposited on the second insulating layer 107, a mask 98a having a specific shape as shown in FIG. 7E is located on the photoresist layer 96, and the photoresist layer 96 is radiated by ultraviolet light to be exposed, developed, and etched. When the second insulating layer 107 and the semiconductor layer 105 are successively etched, the semiconductor layer 105 and the second insulating layer 107 are patterned into the same shape as the mask 98a on the first insulating layer 103, as shown in FIG. 7F.

Referring to FIG. 7G, the ONO layer as a memory layer 109 is formed on the first insulating layer 103 and the second insulating layer 107. Here, as shown in FIG. 6A, the ONO layer is formed of first oxide layer 109a, nitride layer 109b, and second oxide layer 109c. Here, the first and second oxide layers 109a and 109c may be formed by a thermal oxidation or CVD method, or by the thermal oxidation and CVD methods. In this case, annealing or thermal processes are continuously performed to increase the density and stabilization of the layers. Here, the annealing or thermal processes are performed at a temperature of about 700 to 1100° C.

As shown in FIG. 7H, a conductive layer for forming the gate electrode 111 is coated on the memory layer 109 and n-type impurities are heavily doped thereto in order to reduce impurities in the gate electrode 111. Thereafter, as shown in FIG. 7I, a photoresist layer 96 is deposited on the gate electrode 111, and on side and upper surfaces of the semiconductor layer 105 and the second insulating layer 107, and a stripe type mask 98b is positioned on the photoresist layer 96. Then, a photolithography process of exposing and developing by radiating with ultraviolet light is performed on the photoresist layer 96 to etch the photoresist layer 96. As a result, a stripe type memory layer 109 and gate electrode 111 are formed on the sides and the upper surfaces of the semiconductor layer 105 and the second insulating layer 107 and on the upper surface of the first insulating layer 103, as shown in FIG. 7J.

Referring to FIG. 7K, the second insulating layer 107 is anisotropically etched using the patterned gate electrode 111 as a mask in order to remove a portion of the second insulating layer 107 located on the semiconductor layer 105 except for a portion of the second insulating layer 107 located under the memory layer 109. In a subsequent ion doping process, a vertical junction and a silicon top junction where a metal contact will be formed are simultaneously formed on the semiconductor layer 105 in order to prevent difficulties of an ohmic contact in the vertical junction and metal W-contacts when forming the metal contacts.

As shown in FIG. 7L, ions are lightly doped to form a lightly doped drain (LDD) junction (not shown), and a sacrificial insulating layer 113 is blanket deposited on the structure. A photolithography process using a photoresist layer 96 and a mask 98c is performed to form spacers (not shown). Thereafter, an anisotropic etching is performed on the resultant structure as shown in FIG. 7M, such that the sacrificial insulating layer 113 remains on the semiconductor layer 105 at either sides of the second insulating layer 107. Then, ions are heavily doped to the source and drain electrodes S and D in order to form source and drain electrode junctions.

FIG. 7N illustrates a method of depositing the sacrificial insulating layer 113 to perform a metal process for attaining memory operations. Here, after the sacrificial insulating layer 113 is blanket deposited on the memory structure, holes (FIG. 7O) are formed to connect the source and drain electrodes S and D to the external power supply (not shown) and metal is deposited in the holes to form the W-contacts 115 as shown in FIG. 7O. Thereafter, as shown in FIG. 7P, electrode pads 117 are formed on the W-contacts 115 and the external power supply (not shown) is connected to the memory cell to complete the memory cell with vertical channels.

Figure 8:
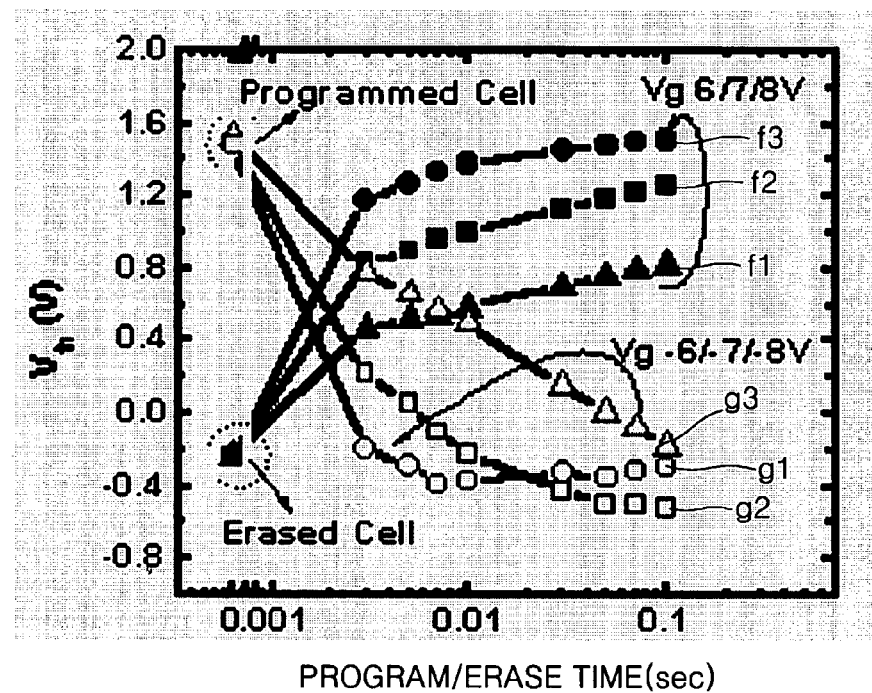
FIG. 8 is a graph illustrating programming and erasing characteristics of a conventional SONOS memory.

FIG. 8 is a graph illustrating programming and erasing characteristics in a conventional SONOS memory.

Referring to FIG. 8, line graphs f1, f2, and f3 illustrate changes in threshold voltages $V_{TH}$ according to a lapse of programming time when programming a conventional SONOS memory cell, and line graphs g1, g2, and g3 illustrate changes in threshold voltages $V_{TH}$ according to a lapse of erasing time when erasing the programmed conventional SONOS memory cell. Here, the line graphs f1, f2, and f3 illustrate changes in the threshold voltages $V_{TH}$ when gate voltages are 6 V, 7 V, and 8 V, respectively. As the gate voltage is increased, the threshold voltages $V_{TH}$ are also increased. The threshold voltages $V_{TH}$ continue to increase with the passage of programming time.

Line graphs g1, g2, and g3 of FIG. 8 illustrate changes in the threshold voltages $V_{TH}$ when the gate voltages are −6 V, −7 V, and −8 V, respectively. Here, the minus signs denote that the voltages are applied in a reverse direction. As the gate voltage is increased, the threshold voltages $V_{TH}$ are also increased. However, in the line graphs g1 and g2, the threshold voltages $V_{TH}$ are not decreased after 0.01 second, because when applying the erasing voltage, the holes tunneling to the nitride layer are coupled with electrons stored in the nitride layer and the electrons are reverse injected from the gate electrode so that the data erasing operation is prevented. This phenomenon has been described as the reason the data erasing efficiency is reduced in a conventional memory. Thus, to improve the erasing efficiency in a conventional method, a thickness of an insulating layer located between the gate electrode and the nitride layer in the SONOS memory is increased in an effort to prevent electron tunneling in the insulating layer.

Referring to the line graphs g1 and g2 of FIG. 8, the threshold voltages $V_{TH}$ decrease as the erasing time increases. However, the threshold voltages $V_{TH}$ of the line graphs g1 and g2 have a steady state where the threshold voltages $V_{TH}$ are the same, and the threshold voltage $V_{TH}$ of the line graph g1 is higher than the threshold voltage $V_{TH}$ of the line graph g2 after the steady state. Such phenomenon occurs when erasing the memory cell but not when programming the memory cell.

Figure 9:
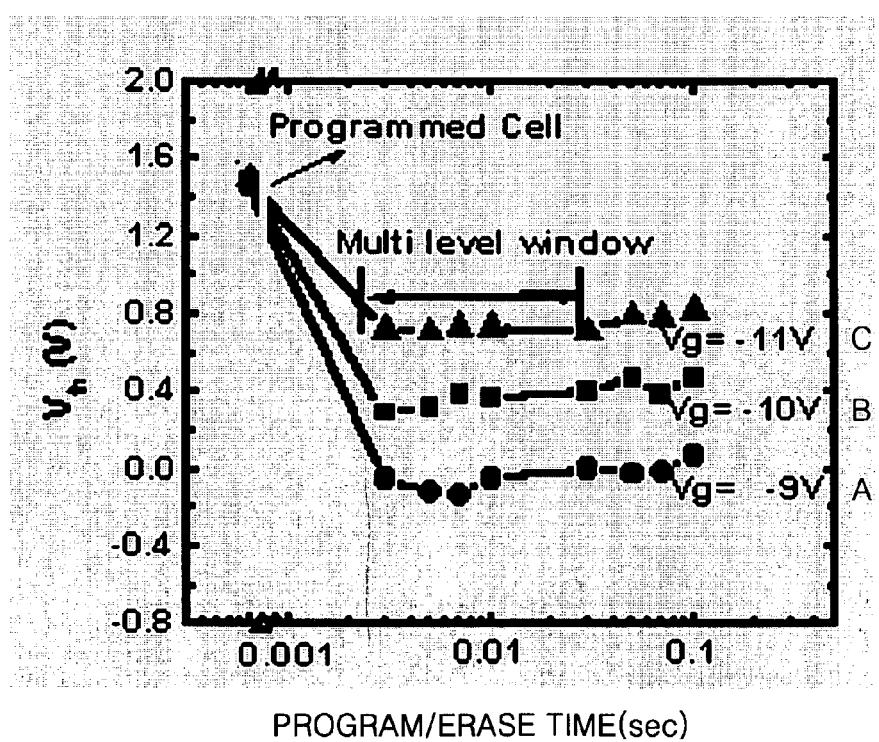
FIG. 9 is a graph illustrating operation characteristics in a SONOS memory with vertical channels, according to the present invention, in response to an erasing voltage.

FIG. 9 is a graph illustrating operational characteristics in a SONOS memory with vertical channels according to the present invention in response to erasing voltages.

Referring to FIG. 9, when an erasing operation begins, threshold voltages $V_{TH}$ decrease. After 0.005 second, the threshold voltages $V_{TH}$ reach saturation voltages, where the threshold voltages $V_{TH}$ are maintained regardless of programming or erasing time. Here, when gate voltages of −9 V, −10 V, and −11V are applied, the threshold voltages $V_{TH}$ become about −0.2 V, 0.3 V, and 0.8 V, respectively, such as when being programmed. States of reaching the saturation voltages of −0.2 V, 0.3 V, and 0.8 V, respectively, correspond to normal states A, B, and C of the graph shown in FIG. 11.

The present invention provides a multi-level programming method to attain a memory with a large capacity by maintaining the normal states and securing multi-level threshold voltages according to gate voltages by applying the gate voltages while maintaining a pertinent thickness of an insulating layer located between the gate electrode and the nitride layer after investigating the saturation mechanism of the threshold voltages in the erasing mode. In addition, the programming method according to the present invention minimizes distribution of the threshold voltages after reaching saturation, thereby providing a stable multilevel memory.

Figure 10:
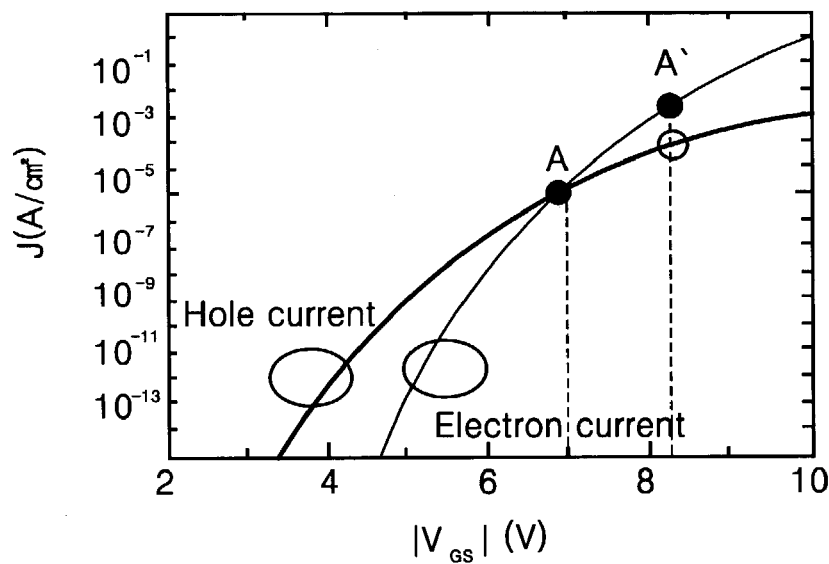
FIG. 10 is a graph illustrating currents of holes as carriers and electrons injected from a bulk and a gate electrode in an erasing operation.
Figure 11:
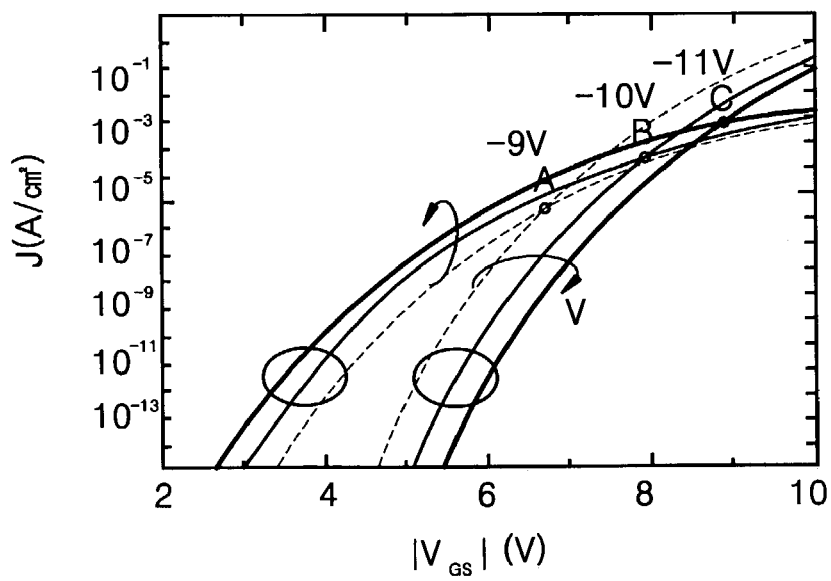
FIG. 11 is a graph illustrating a plurality of normal states by calculating the currents of holes as carriers and electrons injected from a bulk and a gate electrode in an erasing operation.

FIGS. 10 and 11 are graphs illustrating holes as carriers and electrons injected from a bulk and a gate electrode for explaining the normal states and the increase in reverse threshold voltages in an erasing operation. Here, a case of injecting holes injected from the bulk to the gate electrode or a case of injecting electrons injected from the gate electrode to the bulk may be ignored.

Referring to FIG. 10, only a hole current from the bulk exists at a low gate voltage $V_{GS}$, but at a higher gate voltage, i.e., $V_{GS}>7V$, an electron current from the gate electrode predominates. As the gate voltage $V_{GS}$ is increased, a point A where the hole current and the electron current are balanced, i.e., a normal state, is detected. However, as the gate voltage $V_{GS}$ is continuously increased, the balance of the hole current and the electron current, i.e., the normal state, is broken, electrons are accumulated, and the threshold voltages are increased. Here, the accumulation of electrons does not contribute to maintaining continuous threshold voltages, which will be described with reference to FIG. 11.

Referring to FIG. 11, as the gate voltage $V_{GS}$ is increased, a plurality of normal states A, B, and C exist because an average charge in the nitride layer changes. When the gate voltage $V_{GS}$ is continuously increased, however, the normal states A, B, and C end, and the electron currents increase.

Figure 12:
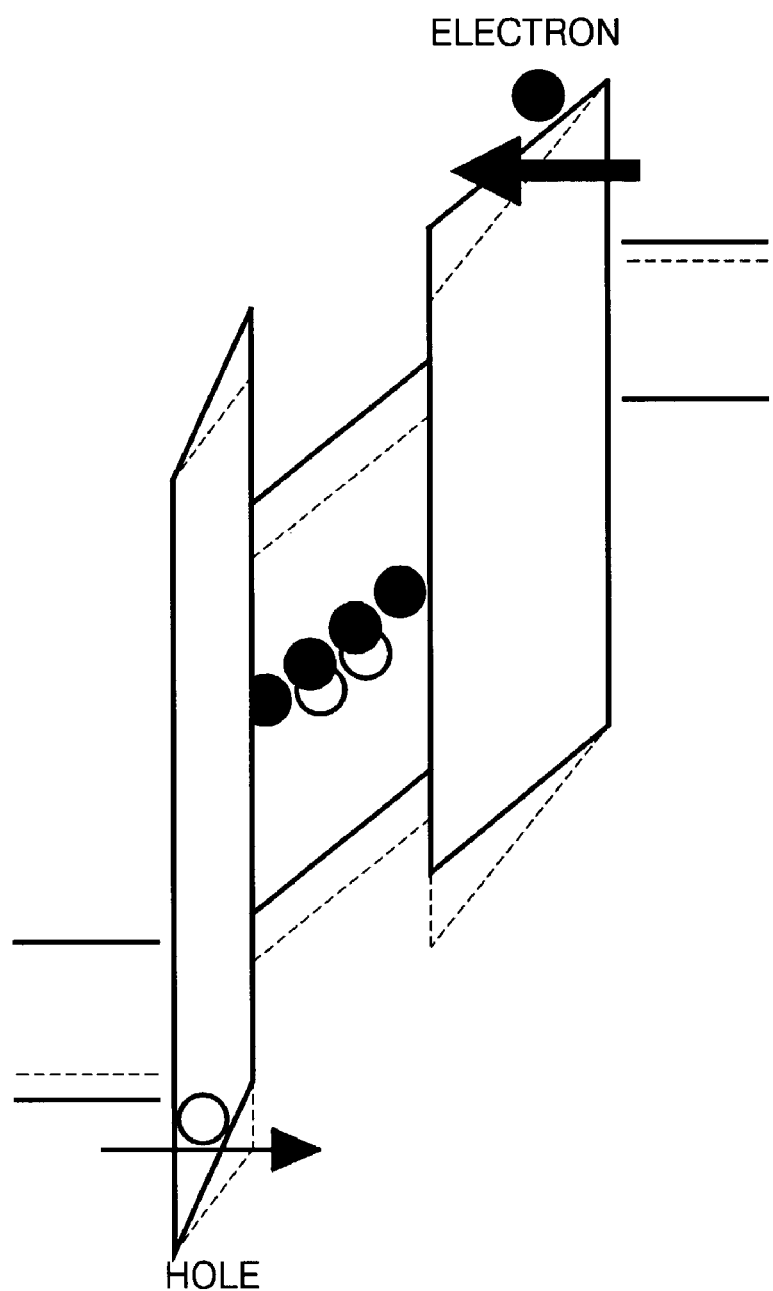
FIG. 12 illustrates an energy band diagram for explaining a saturation mechanism of a threshold voltage according to an increase in a gate voltage when erasing data from a memory cell.

FIG. 12 illustrates an energy band diagram for explaining the saturation mechanism of the threshold voltage according to an increase in a gate voltage when erasing data from a memory cell. The dotted line in FIG. 12 indicates an energy barrier level before increasing the gate voltage and the solid line indicates an energy barrier level after the gate voltage is increased.

As electrons are stored in the nitride layer, the negative charges of the electrons cause the threshold voltage to increase, which means that an energy barrier for holes from the bulk is lowered with respect to hole tunneling, but an energy barrier for electrons from the gate electrode is increased. Increased accumulation of negative charges in the nitride layer changes the tunneling barrier so that the hole current is increased and the electron current is decreased to reach a normal state. Accordingly, the increase of the threshold voltage stops, and a saturation state occurs. In other words, negative feedback exists. The normal states are maintained due to the negative feedback, and the multi-level steady state, in which the level of the saturation voltage changes, is formed by increasing the gate voltage.

Figure 13:
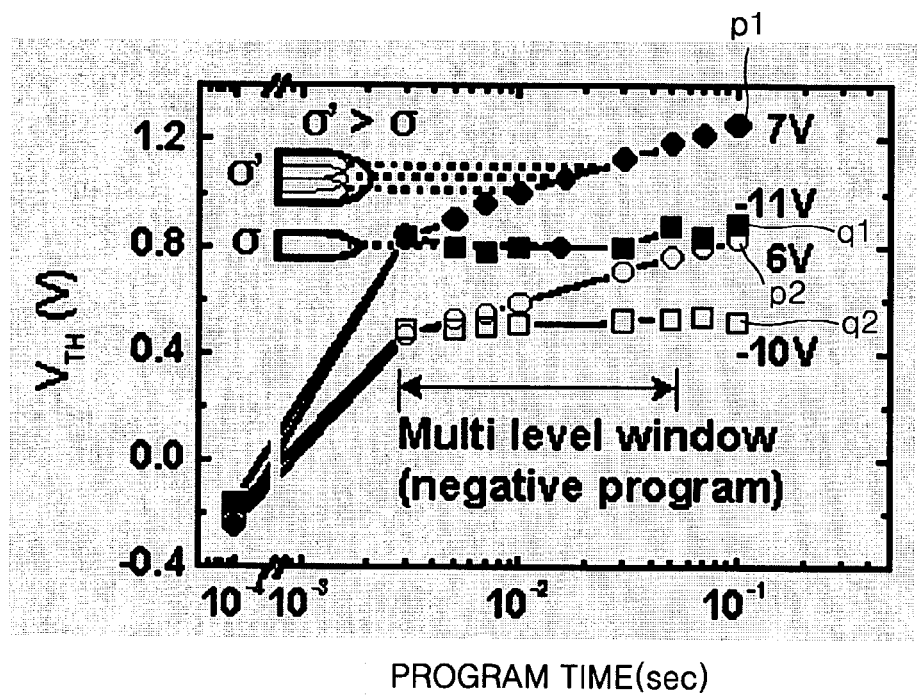
FIG. 13 is a graph illustrating the result of applying threshold voltage change characteristics to a multi-level programming method, wherein changes in a threshold voltage according to a lapse of programming time in a positive voltage programming method, where a conventional positive voltage is applied as a gate voltage, and in a negative voltage programming method according to the present invention, where a negative voltage is applied as the gate voltage, are shown.

FIG. 13 is a graph illustrating a result of applying voltage change characteristics in an erasing operation to a multi-level programming method. Here, the graph illustrates changes in threshold voltages according to a lapse of programming time in a positive voltage programming method, where conventional positive voltages are applied as gate voltages, and in a negative voltage programming method according to the present invention, where negative voltages are applied as gate voltages, after initial cells are erased by applying −8 V for 10 ms.

Threshold voltages $V_{TH}$ increase linearly according to a lapse of programming time in positive voltage programming methods p1 and p2. However, in negative programming methods q1 and q2, the threshold voltages $V_{TH}$ are distributed in a steady state. In the case of a conventional nonvolatile memory cell, the distribution σ' of threshold voltages increases according to a lapse of programming time due to a thickness of an insulating layer or charges trapped in the insulating layer in the initial state of the cell. In addition, threshold voltages of the traditionally programmed cells p1, p2 are distributed according to a specific distribution σ' due to a difference between programming speeds of the cells. However, in q1 and q2, having steady state threshold voltages due to a negative voltage programming method of the present invention, the distribution σ of the threshold voltages due to a lapse of programming time and a difference in programming speeds of the cells is repressed, thereby allowing stable programming of the memory cells.

Figure 14:
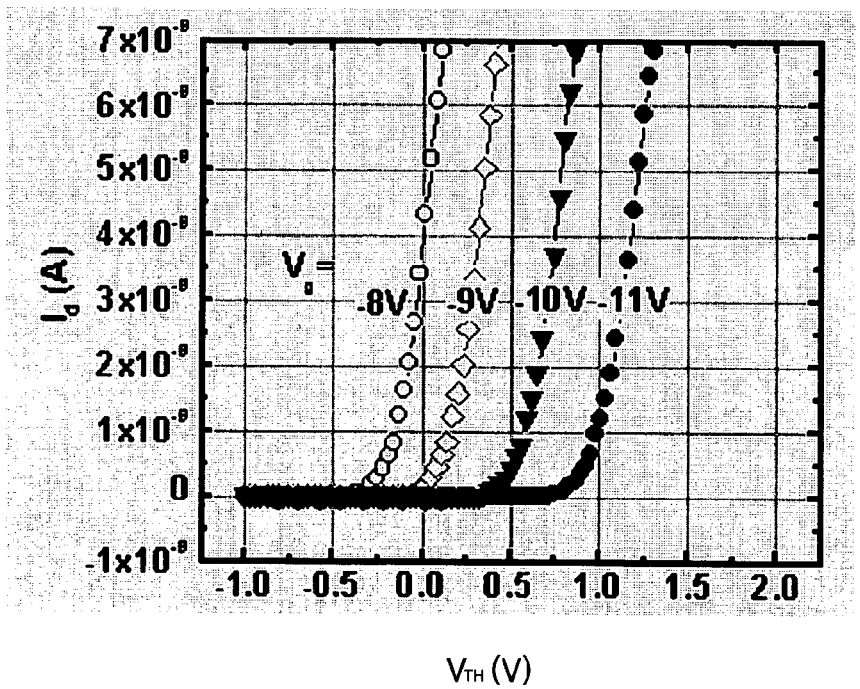
FIG. 14 is a graph illustrating a current-voltage (I-V) characteristic of a multi-level operation method in the negative voltage programming method of the present invention of FIG. 13.

FIG. 14 is a graph illustrating a current-voltage (I-V) characteristic of a multi-level operation method in the negative voltage programming method of FIG. 13. Here, gate voltages are changed from −8 V to −11 V during programming. Referring to FIG. 14, when currents $I_d$ increase suddenly at the multi-level saturation voltage, an I-V characteristic is checked for uniformity.

Figure 15:
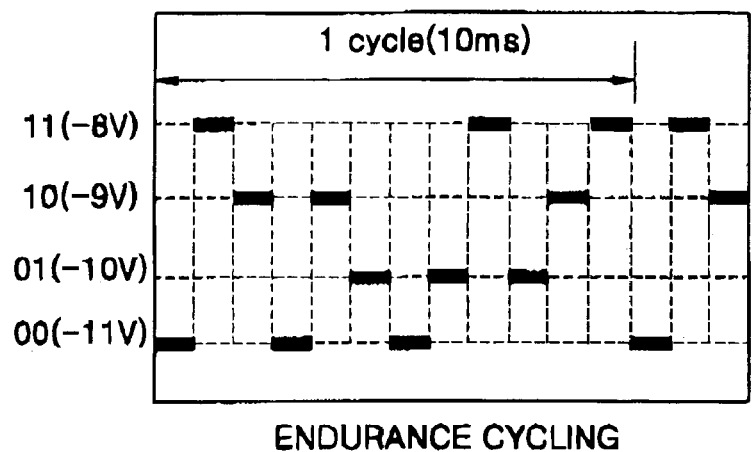
FIG. 15 is a graph illustrating a stress condition for examining the endurance of a multi-level memory cell of the present invention.

FIG. 15 is a graph illustrating a stress condition for examining endurance of a multi-level memory cell of the present invention.

Since the conventional memory cell has one state each for programming and erasing, it is sufficient to repeatedly examine two levels when examining the endurance of the memory cell. If the endurance examination is performed on a reference level of a multi-level memory cell, stress may be applied to only the reference level. Accordingly, a method of examining endurance is provided by using a combination principle in order to apply stress evenly to each level of the multi-level memory cell. In FIG. 15, 12 pulses are applied in one cycle, i.e., 10 ms, where pulse voltages of −11 V (00), −10 V (01), −9 V (10), and −8 (11) are applied, in order to apply stress to each level evenly. Here, by repeatedly applying the stress, the endurance time of the memory cell may be determined.

Figure 16:
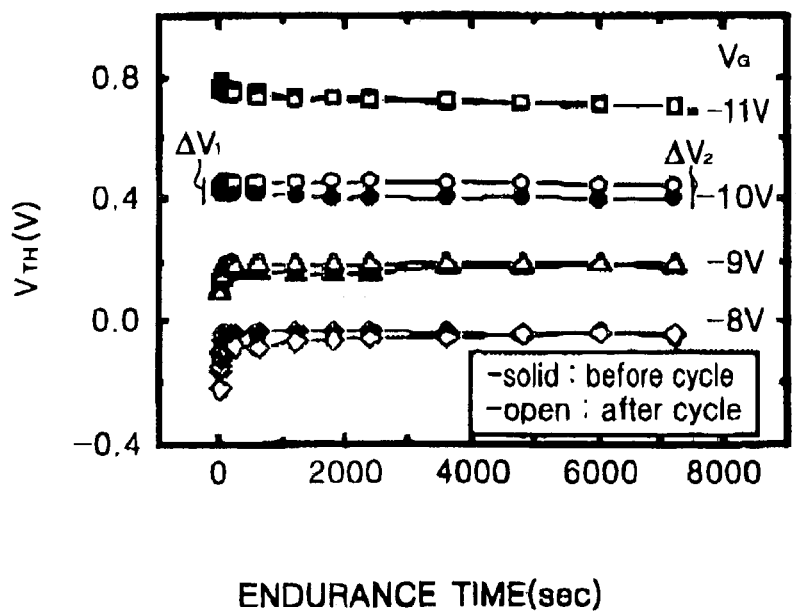
FIG. 16 is a graph illustrating a loss of charges over time in a multi-level memory cell of the present invention by comparing endurances of the memory cell before and after performing the endurance examination of FIG. 15 one hundred times.

FIG. 16 is a graph illustrating a loss of charges according to a lapse of time in the multi-level memory cell of the present invention by comparing an endurance time of the memory cell before and after performing the endurance examination of FIG. 15 one hundred times. At first, the difference $\Delta V_1$ in the threshold voltages $V_{TH}$ before the cycle and after the cycle ranges from 0.03V to 0.04V at the $V_G$ levels of −11 V, −10V, −9V and −8V. After 7,200 seconds, the difference $\Delta V_2$ in the threshold voltages $V_{TH}$ before the cycle and after the cycle ranges from 0.015V to 0.03V at the $V_G$ levels of −11V, −10V, −9V and −8V. Therefore, the difference between the threshold voltages $V_{TH}$ ($\Delta V_2$-$\Delta V_1$) decreases by about 0.01V after 7,200 seconds. However, since the threshold voltages $V_{TH}$ in a balanced state are increased by increasing the gate voltage and gaps between the levels may be changed according to the number of levels, the multi-level condition may be controlled to be stable.

The present invention provides a memory programming method for attaining a single level steady state or a multi-level steady state using a phenomenon in which a gate voltage is stabilized after reaching a saturation voltage when erasing data from a memory cell. Accordingly, the memory programming method of the present invention may be applied to the SONOS memory with vertical channels of the present invention, as well as to a conventional flash memory or SONOS memory, so that a large capacity of data may be programmed without increasing the density of the memory cell.

The present invention also provides a novel SONOS memory with vertical channels and a fabricating method thereof capable of securing a high density while preventing an increase in manufacturing costs, which tend to increase suddenly at a process level of sub 100 nm.

In addition, the present invention secures the memory characteristics of stable multi-level memory by controlling holes and electrons injected from the bulk and the gate electrode, to realize a high capacity multi-level programming method.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon/oxide/nitride/oxide/silicon (SONOS) memory with vertical channels, the SONOS memory comprising:
   a substrate;
   a first insulating layer stacked on the substrate;
   a semiconductor layer, which is patterned on the first insulating layer in a predetermined shape, the semiconductor layer including source and drain electrodes separated by a predetermined interval and lying substantially parallel to the substrate, such that a portion of the semiconductor layer is positioned between the source and drain electrodes, the semiconductor layer being continuous;
   a second insulating layer located on the semiconductor layer between the source and drain electrodes;
   a memory layer, which is deposited on sides of the portion of the semiconductor layer positioned between the source and drain electrodes and on sides and an upper surface of the second insulating layer, the memory layer in direct contact with the sides and including vertical electron transferring channels and an electron storing layer; and
   a gate electrode, which is deposited on a surface of the memory layer, for controlling transfer of electrons in the memory layer.

2. The SONOS memory as claimed in claim 1, wherein the substrate is formed of an n-type semiconductor and the gate electrode is formed of a p-type semiconductor.

3. The SONOS memory as claimed in claim 1, wherein the substrate is formed of a p-type semiconductor and the gate electrode is formed of an n-type semiconductor.

4. The SONOS memory as claimed in claim 1, wherein the memory layer comprises:
   a third insulating layer formed on the portion of the semiconductor layer between the source and drain electrodes;
   the electron storing layer deposited on an upper surface of the third insulating layer and the sides and the upper surface of the second insulating layer; and
   a fourth insulating layer formed on an upper surface of the electron storing layer.

5. The SONOS memory as claimed in claim 1, wherein the first and second insulating layers are formed of silicon oxide.

6. The SONOS memory as claimed in claim 4, wherein the third and fourth insulating layers are formed of silicon oxide.

7. The SONOS memory as claimed in claim 1, wherein the electron storing layer is formed of silicon nitride.

8. The SONOS memory as claimed in claim 4, wherein the electron storing layer is formed of silicon nitride.

9. The SONOS memory as claimed in claim 1, further comprising W-contacts, which are formed on the upper surface of the semiconductor layer, for electrically contacting to the source and drain electrodes, respectively.

10. The SONOS memory as claimed in claim 9, further comprising pad electrodes, which are formed on upper surfaces of the W-contacts, for electrically connecting the W-contacts to a power supply.

11. The SONOS memory as claimed in claim 1, wherein the semiconductor layer is formed of a first portion extending in a first direction and second portions extending in a second direction, which is perpendicular to the first direction, at left and right ends of the first portion.

12. The SONOS memory as claimed in claim 1, wherein the vertical electron transferring channels each extend substantially along an entire height of a corresponding side of the semiconductor layer.

13. A silicon/oxide/nitride/oxide/silicon (SONOS) memory, comprising:
   a semiconductor material including source and drain electrodes separated by a predetermined interval, such that a portion of the semiconductor material is positioned between the source and drain electrodes;
   a first insulating layer located on the semiconductor material between the source and drain electrodes;
   a memory layer, which is deposited on sides of the portion of the semiconductor material positioned between the source and drain electrodes and on sides and an upper surface of the first insulating layer, the memory layer in direct contact with the sides and including electron transferring channels and an electron storing layer and further including:
      a second insulating layer formed on the portion of the semiconductor material between the source and drain electrodes, the electron storing layer deposited on an upper surface of the second insulating layer and the sides and the upper surface of the first insulating layer, and
      a third insulating layer formed on an upper surface of the electron storing layer; and
   a gate electrode, which is deposited on a surface of the memory layer, for controlling transfer of electrons in the memory layer.

14. The SONOS memory as claimed in claim 13, wherein the second and third insulating layers are formed of silicon oxide.

15. The SONOS memory as claimed in claim 13, wherein the electron storing layer is formed of silicon nitride.

16. The SONOS memory as claimed in claim 13, further comprising W-contacts, which are formed on the upper surface of the semiconductor material, for electrically contacting to the source and drain electrodes, respectively.

17. The SONOS memory as claimed in claim 16, further comprising pad electrodes, which are formed on upper surfaces of the W-contacts, for electrically connecting the W-contacts to a power supply.

18. A memory device, comprising:
   a substrate, the substrate having a first insulator thereon;
   a semiconductor element on the first insulator, wherein the semiconductor element includes a source region, a channel region, and a drain region, and wherein a major surface of the semiconductor element is disposed substantially parallel to the substrate;
   a memory element; and
   a second insulator on the semiconductor element, wherein the second insulator overlies the channel region and is interposed between the channel region and the memory element, wherein the memory element comprises a third insulator, an electron trap on the third insulator, and a fourth insulator on the electron trap, such that the electron trap is interposed between the third insulator and the fourth insulator.

19. The memory device as claimed in claim 18, wherein the memory element is disposed so as to be in contact with two opposing sides of the semiconductor element, and wherein the memory element is disposed to cross the second insulator on the semiconductor element directly above the channel region.

20. The memory device as claimed in claim 19, wherein the two opposing sides of the semiconductor element are substantially perpendicular to the major surface of the semiconductor element.

21. The memory device as claimed in claim 19, wherein a thickness of the second insulator on the semiconductor element is sufficient to cause a current flowing through the channel region lying directly below the second insulator to be less than a current flowing through the channel region at the two opposing sides.

22. The memory device as claimed in claim 18, wherein the source, channel, and drain regions are each about equidistant from the substrate.

23. The memory device as claimed in claim 22, wherein the source region, the channel region, and the drain region are formed from a single semiconductor layer, the semiconductor layer formed on the substrate such that the semiconductor layer is substantially parallel to the substrate.

24. The memory device as claimed in claim 18, wherein the electron trap includes a nitride.

25. The memory device as claimed in claim 18, further comprising a gate electrode on the memory element.

* * * * *